(12) United States Patent
Chen et al.

(10) Patent No.: US 11,967,591 B2
(45) Date of Patent: Apr. 23, 2024

(54) INFO PACKAGES INCLUDING THERMAL DISSIPATION BLOCKS

(71) Applicant: Taiwan Semiconductor Manufacturing Co., Ltd., Hsinchu (TW)

(72) Inventors: Yu-Hao Chen, Hsinchu (TW); Fong-Yuan Chang, Hsinchu (TW); Po-Hsiang Huang, Tainan (TW); Ching-Yi Lin, Zhubei (TW); Jyh Chwen Frank Lee, Palo Alto, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 231 days.

(21) Appl. No.: 17/396,368

(22) Filed: Aug. 6, 2021

(65) Prior Publication Data
US 2023/0037331 A1    Feb. 9, 2023

(51) Int. Cl.
| | | |
|---|---|---|
| *H01L 25/18* | (2023.01) | |
| *H01L 21/48* | (2006.01) | |
| *H01L 21/56* | (2006.01) | |
| *H01L 23/31* | (2006.01) | |
| *H01L 23/367* | (2006.01) | |
| *H01L 23/498* | (2006.01) | |
| *H01L 23/538* | (2006.01) | |

(52) U.S. Cl.
CPC .......... *H01L 25/18* (2013.01); *H01L 21/4857* (2013.01); *H01L 21/568* (2013.01); *H01L 23/3128* (2013.01); *H01L 23/367* (2013.01); *H01L 23/49816* (2013.01); *H01L 23/5383* (2013.01); *H01L 23/5389* (2013.01)

(58) Field of Classification Search
CPC ... H01L 25/18; H01L 21/4857; H01L 21/568; H01L 23/3128; H01L 23/367; H01L 23/49816; H01L 23/5383; H01L 23/5389
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |

(Continued)

FOREIGN PATENT DOCUMENTS

| | | |
|---|---|---|
| TW | 202111882 A | 3/2021 |
| TW | 202114090 A | 4/2021 |

*Primary Examiner* — Fernando L Toledo
*Assistant Examiner* — Neil R Prasad
(74) *Attorney, Agent, or Firm* — Slater Matsil, LLP

(57) ABSTRACT

A method of forming a semiconductor device includes forming a first interconnect structure over a carrier; forming a thermal dissipation block over the carrier; forming metal posts over the first interconnect structure; attaching a first integrated circuit die over the first interconnect structure and the thermal dissipation block; removing the carrier; attaching a semiconductor package to the first interconnect structure and the thermal dissipation block using first electrical connectors and thermal dissipation connectors; and forming external electrical connectors, the external electrical connectors being configured to transmit each external electrical connection into the semiconductor device, the thermal dissipation block being electrically isolated from each external electrical connection.

20 Claims, 33 Drawing Sheets

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2018/0033771 A1* | 2/2018 | Yu .......................... H01L 25/50 |
| 2018/0233457 A1* | 8/2018 | Chen ...................... H01L 21/56 |
| 2019/0189599 A1 | 6/2019 | Baloglu et al. |
| 2020/0006196 A1* | 1/2020 | Lin .................... H01L 23/3675 |
| 2020/0273773 A1* | 8/2020 | Wan ..................... H01L 21/568 |
| 2021/0074600 A1 | 3/2021 | Jeng et al. |
| 2021/0098380 A1 | 4/2021 | Chen et al. |
| 2021/0159147 A1 | 5/2021 | Lin et al. |

\* cited by examiner

INFO PACKAGES INCLUDING THERMAL DISSIPATION BLOCKS

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

In some packaging processes, device dies are sawed from wafers before they are packaged, wherein redistribution lines are formed to connect to the device dies. An advantageous feature of this packaging technology is the possibility of forming fan-out packages, which means the I/O pads on a die can be redistributed to a greater area than the die, and hence the number of I/O pads on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
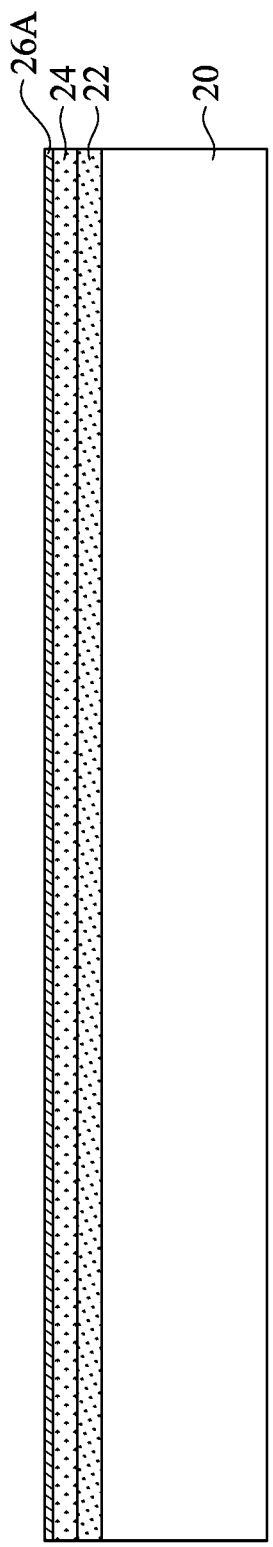
FIGS. 1-8, 9A, 10-15, 16A, 17A-G, and 18 illustrate the cross-sectional views of intermediate stages in the formation of semiconductor packages including thermal dissipation elements in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

A package including thermal dissipation elements and the method of forming the same are provided. In accordance with some embodiments of the present disclosure, a first package component includes a thermal dissipation block comprising thermal dissipation elements located close to a heat-generating element, such as a die. The thermal dissipation block may be formed of the same material and in simultaneous processes as with redistribution lines in an adjacent interconnect structure. The thermal dissipation block may include portions distributed in a plurality of metal layers, and the portions may be physically interconnected through vias for enhanced thermal dissipation ability. Thermal dissipation connectors (in addition to electrical connectors) may help to attach a second package component to the first package component. As a result, while the electrical connectors facilitate electrical connection between the first and second package components, the thermal dissipation connectors facilitate additional heat dissipation from the thermal dissipation block, such as into and through the second package component.

FIGS. 1 through 8, 9A through 9C, 10 through 15, 16A through 16C, 17A through 17F, and 18 illustrate the cross-sectional views of intermediate stages in the formation of embodiments of semiconductor packages, including a thermal dissipation block, thermal dissipation connectors, and other thermal dissipation elements in accordance with some embodiments of the present disclosure. The corresponding processes are also reflected schematically in the process flow shown in FIG. 19.

Referring to FIG. 1, carrier 20 is provided, and release film 22 is coated on carrier 20. Carrier 20 is a substrate formed of a transparent material, and may be a glass carrier, a ceramic carrier, or the like. Release film 22 may be formed of a Light-To-Heat-Conversion (LTHC) coating material. Release film 22 may be applied onto carrier 20 through coating. In accordance with some embodiments of the present disclosure, the LTHC coating material is capable of being decomposed under the heat of light/radiation (such as laser), and hence can release carrier 20 from the structure formed thereon.

In accordance with some embodiments, as shown in FIG. 1, dielectric layer 24 is formed on release film 22. Dielectric layer 24 may be formed of or comprise a polymer such as polybenzoxazole (PBO), polyimide, benzocyclobutene (BCB), or the like.

Figure 2:
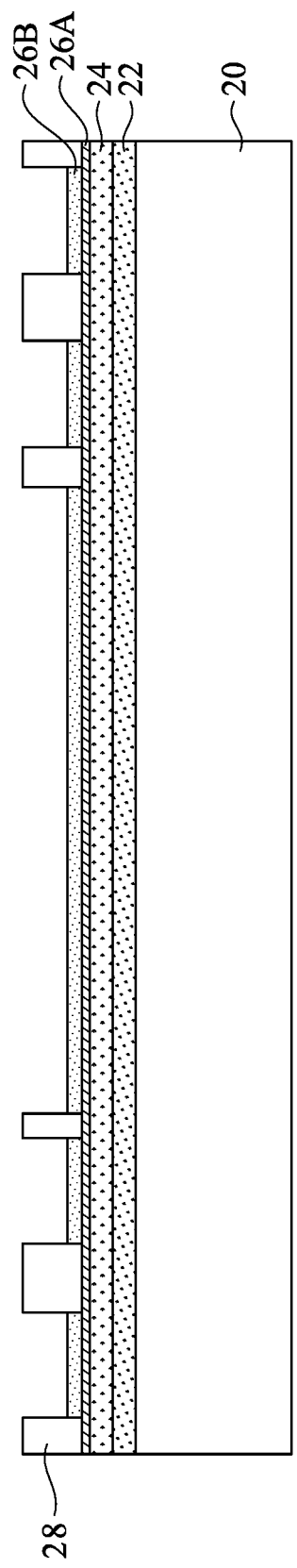

Metal seed layer 26A is deposited over dielectric layer 24. The respective process is illustrated as process 202 in the process flow 200 shown in FIG. 19. In accordance with some embodiments of the present disclosure, metal seed layer 26A includes a titanium layer and a copper layer over the titanium layer. The metal seed layer may be formed through, for example, using Physical Vapor Deposition (PVD), Chemical Vapor Deposition (CVD), or the like. Next, as shown in FIG. 2, a patterned plating mask 28 is applied and patterned. The respective process is illustrated as process 204 in the process flow 200 shown in FIG. 19. In accordance with some embodiments, the patterned plating mask 28 comprises a patterned photo resist. In accordance with alternative embodiments, plating mask 28 comprises a dry film, which is laminated and then patterned. Some portions of metal seed layer 26A are exposed through the patterned plating mask 28.

Figure 3:
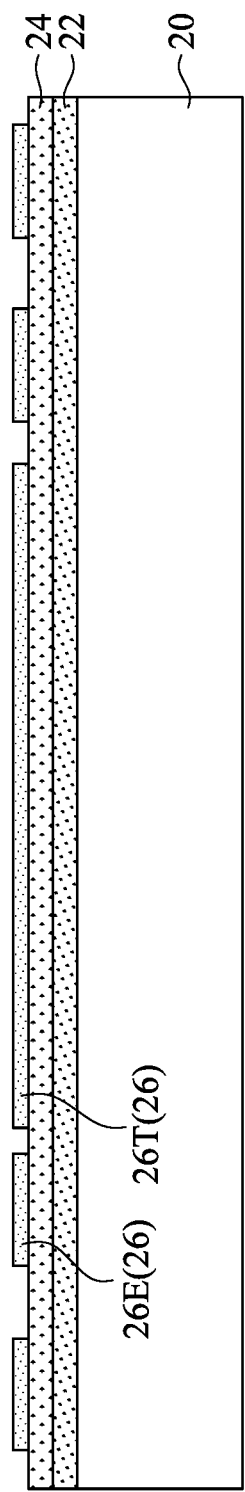

Next, metallic material 26B is deposited on the exposed portions of metal seed layer 26A. The respective process is illustrated as process 206 in the process flow 200 shown in FIG. 19. The deposition process may include a plating process, which may be an electro-chemical plating process or an electro-less plating process. Metallic material 26B may include Cu, Al, Ti, W, Au, or the like. After the plating process, the patterned plating mask 28 is removed, exposing the underlying portions of metal seed layer 26A. The respective process is illustrated as process 208 in the process flow 200 shown in FIG. 19. The exposed portions of metal seed layer 26A are then removed, leaving conductive (metallic) features 26 as shown in FIG. 3. Conductive features 26 include the remaining portions of metal seed layer 26A and the plated metallic material 26B. Conductive features 26 include thermal dissipation features 26T, and electrical Redistribution Lines (RDLs) 26E. In accordance with some embodiments, thermal dissipation features 26T are used for dissipating heat, and may or may not be used for the electrical functions of the resulting package. RDLs 26E, on the other hand, are used for the electrical functions.

Figure 4:
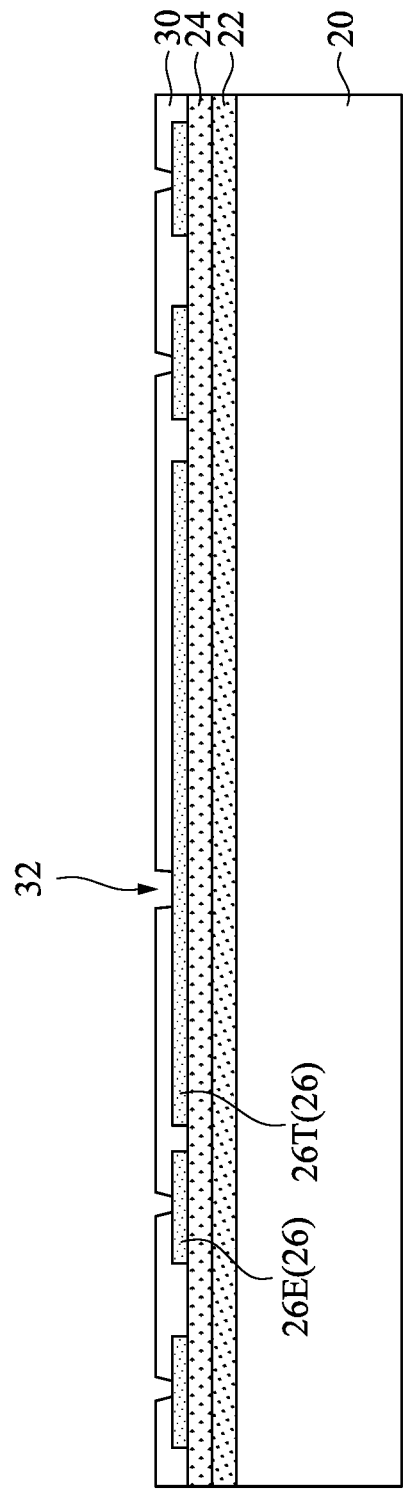

Further referring to FIG. 4, dielectric layer 30 is formed on thermal dissipation features 26T and RDLs 26E. The respective process is illustrated as process 210 in the process flow 200 shown in FIG. 19. The bottom surface of dielectric layer 30 is in contact with the top surfaces of thermal dissipation features 26T, RDLs 26E, and dielectric layer 24. In accordance with some embodiments of the present disclosure, dielectric layer 30 is formed of a polymer, which may be a photo-sensitive material such as PBO, polyimide, BCB, or the like. In accordance with alternative embodiments, dielectric layer 30 is formed of an inorganic dielectric material, which may include a nitride such as silicon nitride, or an oxide such as silicon oxide, phosphosilicate glass (PSG), borosilicate glass (BSG), boron-doped phosphosilicate glass (BPSG), fluorine-doped silicate glass (FSG), or the like. Dielectric layer 30 is then patterned to form openings 32 therein. Hence, some pad portions of thermal dissipation features 26T and RDLs 26E are exposed through openings 32.

Figure 5:
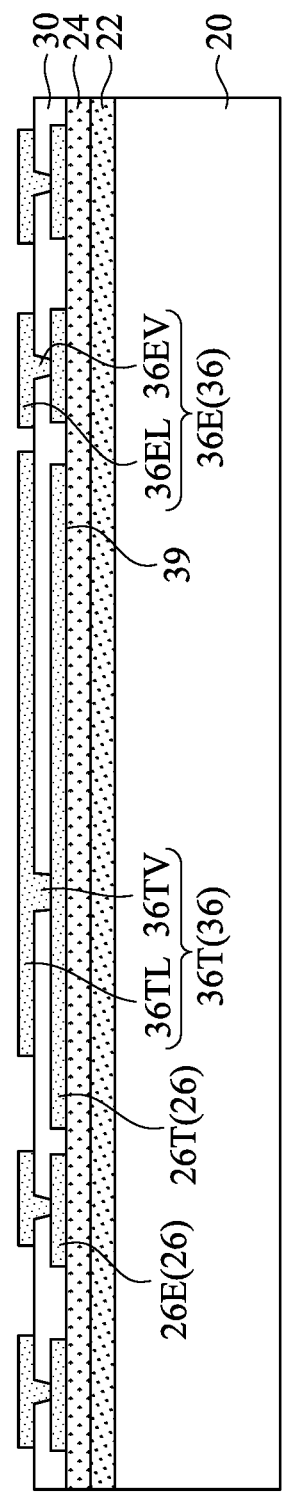

FIG. 5 illustrates the formation of conductive features 36, which include thermal dissipation feature 36T and RDLs 36E. The respective process is illustrated as process 212 in the process flow 200 shown in FIG. 19. Each of the conductive features 36 may include a via portion and a line portion. For example, thermal dissipation feature 36T may include line portion 36TL and via portion (also referred to as a via) 36TV. RDLs 36E may include line portions 36EL and the corresponding via portions (also referred to as vias) 36EV. In accordance with some embodiments, thermal dissipation feature 36T is in physical contact with thermal dissipation features 26T. RDLs 36E are in contact with the respective underlying RDLs 26E. The formation of conductive features 36 may adopt the methods and materials similar to those for forming thermal dissipation features 26T and RDLs 26E. Also, each of vias 36TV and 36EV may have a tapered profile, with the upper portions being wider than the corresponding lower portions.

Figure 6:
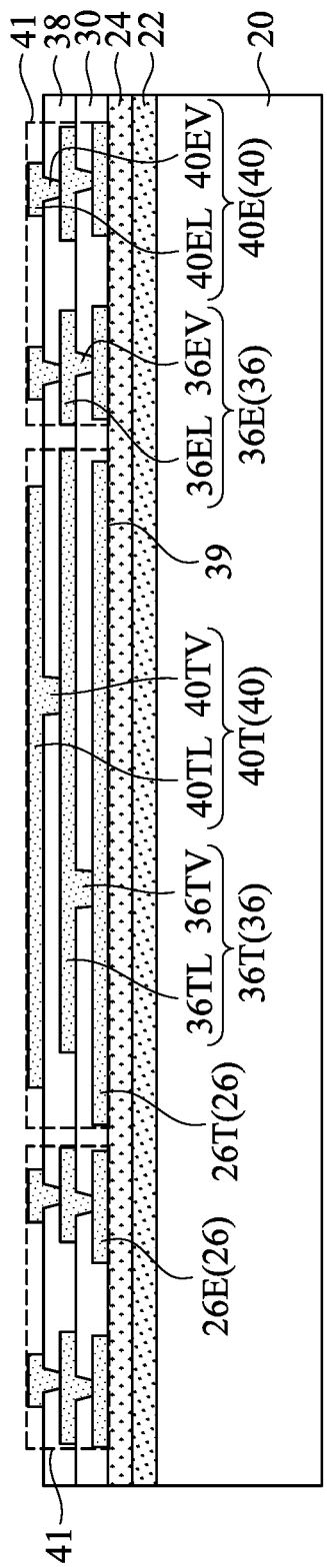

FIG. 6 illustrates the formation of dielectric layers 38 and conductive features 40, which include thermal dissipation feature 40T and RDLs 40E. The respective processes are illustrated as processes 214 and 216 in the process flow 200 shown in FIG. 19. In accordance with some embodiments of the present disclosure, dielectric layer 38 is formed of a material selected from the same group of candidate materials for forming dielectric layers 38 and 30, and may include organic materials or inorganic materials, as aforementioned.

It is appreciated that although in the illustrated example embodiments, two dielectric layers 30 and 38, and the respective thermal dissipation features 26T, 36T, and 40T and RDLs 26E, 36E, and 40E are discussed as examples, fewer or more dielectric layers and conductive layers may be adopted, depending on the signal routing requirement. Throughout the description, RDLs 26E, 36E, and 40E are collectively referred to as back-side interconnect structure 41, which is on the back-side of the subsequently placed device die. Thermal dissipation features 26T, 36T, and 40T are collectively referred to as thermal dissipation block 39. For the sake of illustration, the dashed boxes indicate that back-side interconnect structure 41 and thermal dissipation block 39 have outer edges which are the farthest outer edges of the conductive material that composes each, such as RDLs 26E/36E/40E and thermal dissipation features 26T/36T/40T, respectively. As further illustrated, portions of back-side interconnect structure 41 may be on opposing sides of thermal dissipation block 39.

For example, there may be three or more layers of conductive features 26/36/40 in both back-side interconnect structure 41 and thermal dissipation block 39. In some embodiments not specifically illustrated, there are more layers of back-side interconnect structure 41 than layers of thermal dissipation block 39, such that back-side interconnect structure 41 extends farther away from carrier 20. In subsequent steps, other conductive elements are formed in contact with thermal dissipation block 39, however, thermal dissipation block 39 and those other conductive elements will remain electrically isolated from external electrical connection (e.g., not receiving or transmitting electrical signal, power, or ground), including from back-side interconnect structure 41 which is used for electrical signal routing, in the completed semiconductor package. As a result, thermal dissipation block 39 and those other conductive elements will facilitate heat dissipation from one or more nearby heat-generating elements subsequently formed or attached in the completed semiconductor package. Due to thermal dissipation block 39 (e.g., thermal dissipation features 26T/36T/40T) being electrically isolated from electrical signal routing laterally (e.g., electrically isolated from back-side interconnect structure 41) and above (e.g., electrically isolated from package component 50 and metal posts 48), thermal dissipation block 39 may be referred to as dangling or electrically dangling or electrically floating.

As illustrated, thermal dissipation block 39 is laterally adjacent to back-side interconnect structure 41. Similarly, thermal dissipation features 26T/36T/40T are laterally adjacent to respective RDLs 26E/36E/40E. A distance between any one of thermal dissipation features 26T/36T/40T and a closest one of RDLs 26E/36E/40E may be between about 1 µm and about 8 µm. Parasitic capacitance and electrical shorting may be prevented with the distance being at least about 1 µm.

Figure 7:
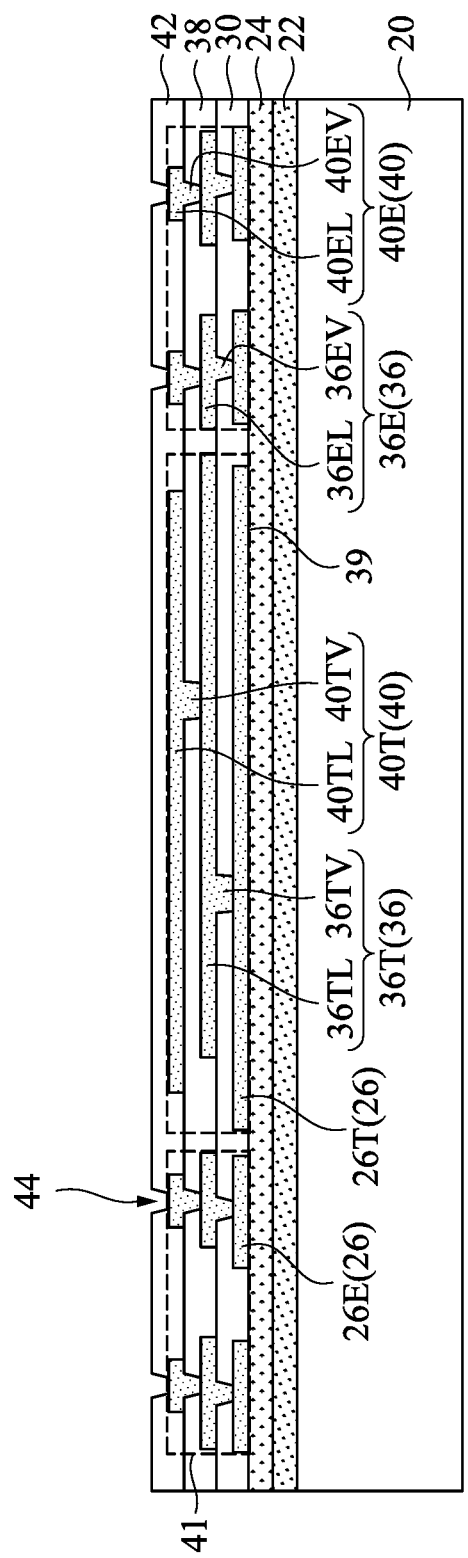

Referring to FIG. 7, dielectric layer 42 is formed to cover the underlying conductive features 40. The respective process is illustrated as process 218 in the process flow 200 shown in FIG. 19. In accordance with some embodiments, dielectric layer 42 may be formed of or comprises a material selected from the same group of candidate dielectric materials for forming the underlying dielectric layers 30 and 38. For example, dielectric layer 42 may be formed of a polymer, which may be a photo-sensitive material such as PBO, polyimide, BCB, or the like. In accordance with alternative embodiments, dielectric layer 42 is formed of an inorganic dielectric material, which may include a nitride such as silicon nitride, an oxide such as silicon oxide, or the like. Dielectric layer 42 is then patterned to form openings 44 therein.

Figure 8:
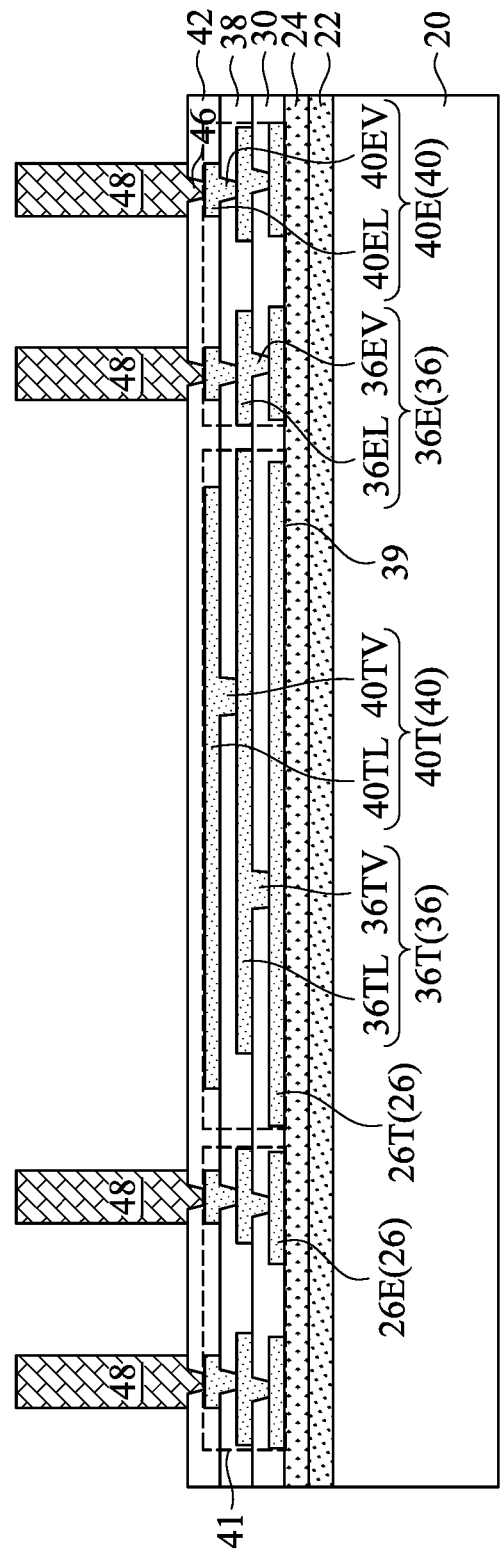

Referring to FIG. 8, vias 46 are formed in opening 44, and metal posts 48 are formed over and joined with vias 46. The respective process is illustrated as process 220 in the process flow 200 shown in FIG. 19. Vias 46 and metal posts 48 may be formed in common formation processes. In accordance with some embodiments, the formation processes include depositing a metal seed layer, forming a plating mask (not shown) over the metal seed layer, plating a metallic material in the openings in the plating mask, removing the plating mask, and etching the portions of the metal seed layer previously covered by the plating mask. In accordance with some embodiments of the present disclosure, the metal seed layer may include a titanium layer and a copper layer over the titanium layer. The formation of the metal seed layer may include PVD, CVD, or the like. The plating mask may include photo resist. The plated metallic material may include copper or a copper alloy, tungsten, or the like. The plated metallic material and the remaining portions of the metal seed layer thus form vias 46 and the metal posts 48.

FIGS. 9A through 9E illustrate the placement/attachment of package component 50, with Die-Attach Film (DAF) 52 being used to adhere package component 50 to dielectric layer 42. The respective process is illustrated as process 222 in the process flow 200 shown in FIG. 19. Although one package component 50 is illustrated, there may be a plurality of package components being placed, which may be the same as each other or different from each other. In accordance with some embodiments, package component 50 is a device die, a package with a device die(s) packaged therein, a System-on-Chip (SoC) die including a plurality of integrated circuits (or device dies) integrated as a system, or the like. The device die in package component 50 may be or may comprise a logic die, a memory die, an input-output die, an Integrated Passive Device (IPD), or the like, or combinations thereof. For example, the logic die in package component 50 may be a Central Processing Unit (CPU) die, a Graphic Processing Unit (GPU) die, a mobile application die, a Micro Control Unit (MCU) die, a BaseBand (BB) die, an Application processor (AP) or Application-Specific integrated circuit (ASIC) die, or the like. The memory die in package component 50 may include a Static Random Access Memory (SRAM) die, a Dynamic Random Access Memory (DRAM) die, or the like. Package component 50 may include dielectric layer 56 and electrical connectors 54 (such as metal pillars, micro-bumps, and/or bond pads) embedded in dielectric layer 56.

In accordance with some embodiments, package component 50 is placed directly over thermal dissipation block 39.

For example, a lowermost surface of package component 50 may be vertically displaced from a topmost surface of thermal dissipation block 39 (e.g., thermal dissipation feature 40T if there are only three layers) by between about 2 µm and about 8 µm. The vertical displacement being less than about 8 µm provides an efficient transfer of heat from the package component 50 to the thermal dissipation block 39. The vertical displacement may be greater than 2 µm due to thicknesses of layers (e.g., dielectric layer 38 and DAF 52) between package component 50 and thermal dissipation block 39 and to ensure adequate isolation of thermal dissipation block 39 from electrical signals in package component 50.

In some embodiments, some or all sidewalls of thermal dissipation block 39 (e.g., the farthest edges of the conductive material of thermal dissipation features 26T/36T/40T) may be aligned with package component 50. Also, in accordance with some embodiments, farthest edges of the conductive material of the thermal dissipation features most proximal to package component 50 (e.g., thermal dissipation features 40T, unless there are more than three layers) may be aligned with package component 50, while the thermal dissipation features less proximal to package component 50 (e.g., thermal dissipation features 26T/36T) may be within or extend beyond sidewalls of package component 50.

In accordance with some embodiments, package component 50 is a heat-generating element, such that during use of the completed semiconductor package, package component 50 may generate a disproportionate amount of heat as compared to most other elements. For example, a lower portion of package component 50 adjacent to DAF 52 may generate the heat, which may transfer to DAF 52 and further to dielectric layer 42 (and to dielectric layers 38/32 to lesser degrees). DAF 52 and dielectric layers 42/38/30 have low thermal conductivity. As such, thermal dissipation block 39 is able to receive some of the heat from dielectric layers 42/38/32 and conduct the heat away from package component 50. For example, during use of a version of the completed semiconductor package formed without thermal dissipation block 39, a back surface of package component 50 (e.g., proximal to DAF 52) may have a temperature as high as 113° C. However, during use of the completed semiconductor package with thermal dissipation block 39, the temperature may be reduced to 103° C.

Figure 9A:
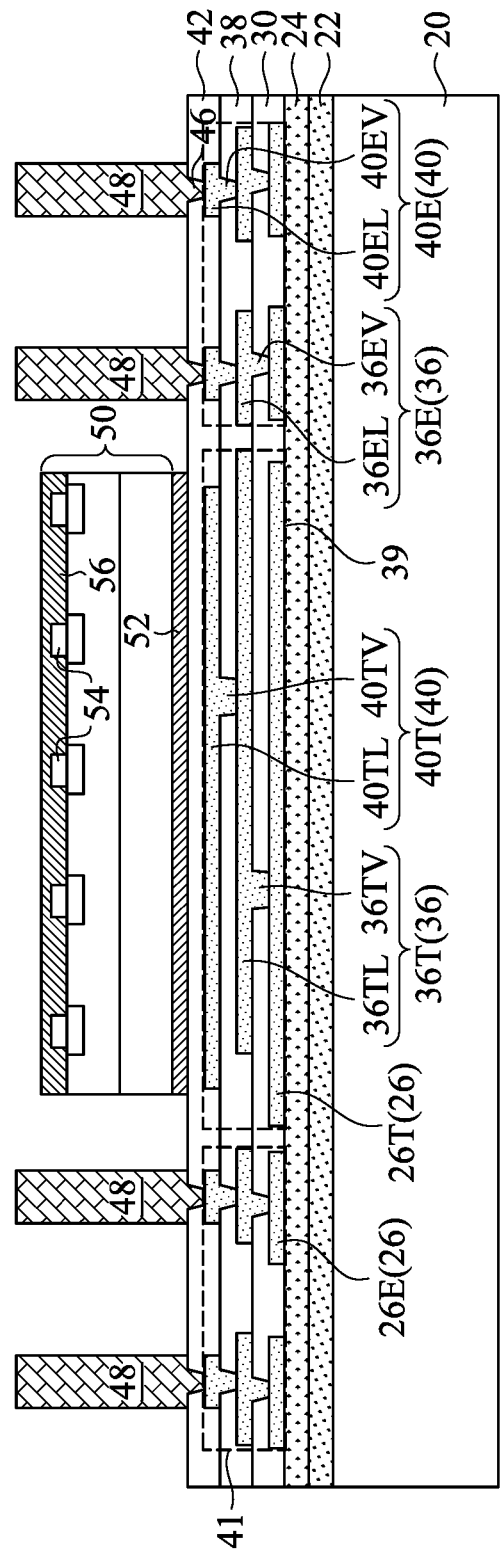
Figure 9B:
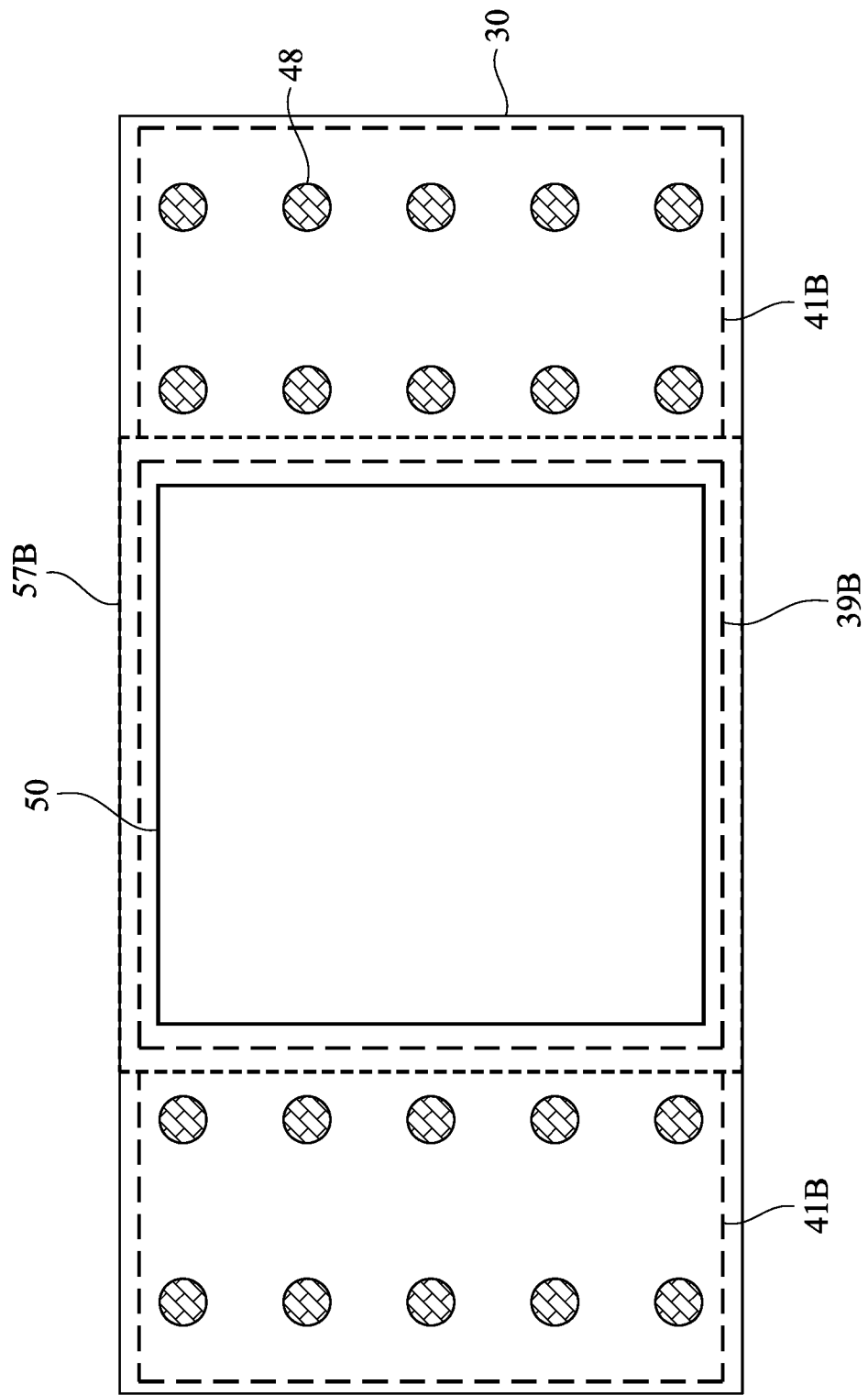
FIGS. 9B, 9C, 9D, 9E 16B, 16C, 16D, and 16E illustrate plan views of intermediate stages in the formation of semiconductor packages including thermal dissipation elements in accordance with some embodiments.

According to some embodiments, FIG. 9B illustrates a plan view in which portions of back-side interconnect structure 41B border opposing sides of thermal dissipation block 39B and package component 50. The dashed box for thermal dissipation block 39B indicates that the farthest edges of the conductive material of thermal dissipation features 26T/36T/40T may extend beyond some or all of edges of package component 50.

Similarly, the dashed box for back-side interconnect structure 41B indicates that all of the farthest edges of the conductive material of RDLs 26E/36E/40E may not extend over edges of package component 50. As a result, a thermal dissipation window 57B indicates a continuous region below package component 50 (e.g., within dielectric layers 30/38/42) that will be free of electrical activity (e.g., electrical signal, power, or ground) in the completed semiconductor package. As illustrated, the continuous region of thermal dissipation window 57B has outer edges aligned with farthest edges of back-side interconnect structure 41 and edges of the completed semiconductor package.

Although not specifically illustrated, in some embodiments, thermal dissipation block 39B may not extend beyond all or any edges of package component 50. However, thermal dissipation window 57B would still be as illustrated due to having outer edges aligned with edges of back-side interconnect structure 41 and the completed semiconductor package, as described above.

Figure 9C:
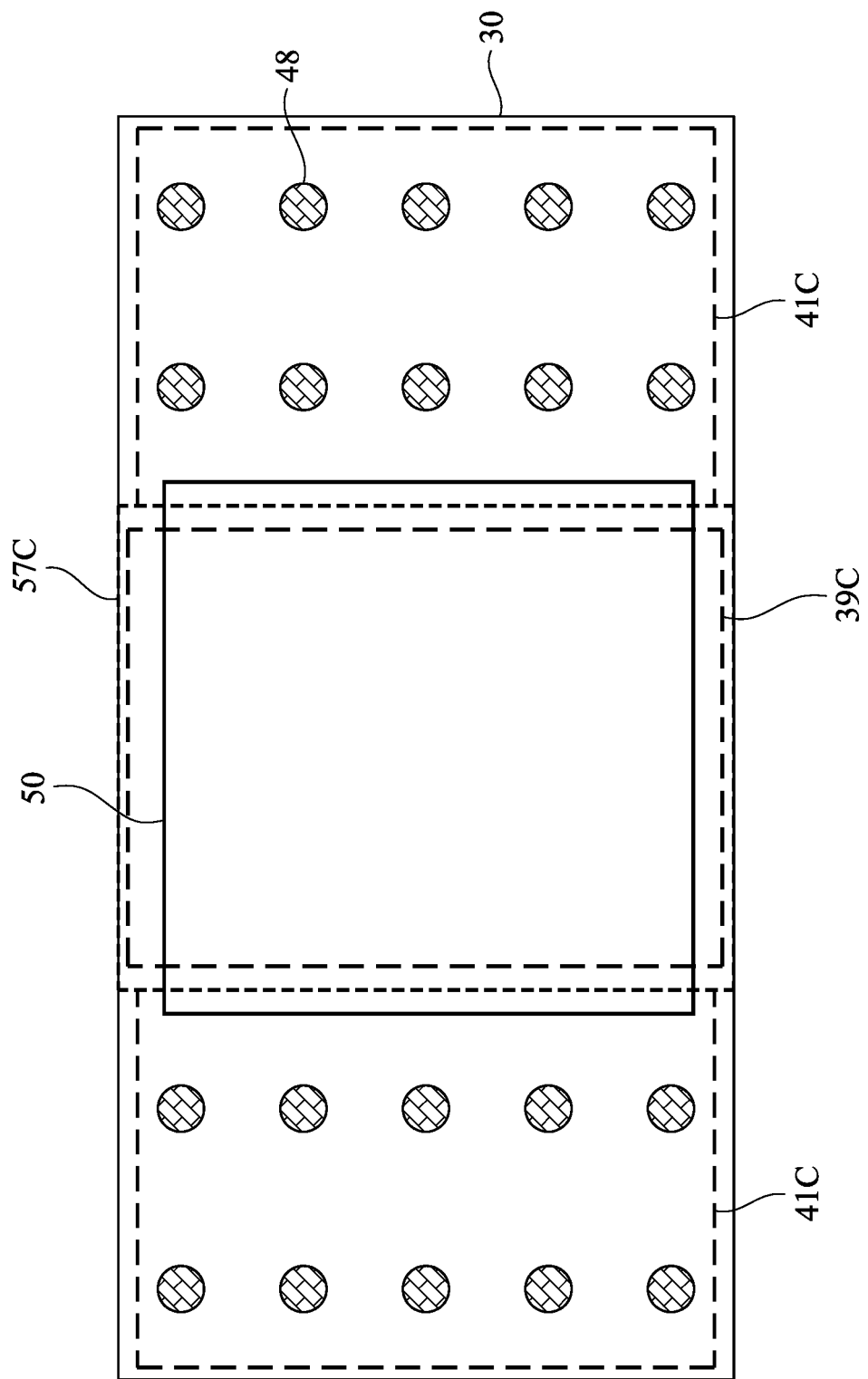

According to other embodiments, FIG. 9C illustrates a plan view in which portions of back-side interconnect structure 41C border opposing sides of thermal dissipation block 39C. The dashed box for thermal dissipation block 39C indicates that the farthest edges of the conductive material of thermal dissipation features 26T/36T/40T may extend beyond some and stay within some of the edges of package component 50.

The dashed box for back-side interconnect structure 41C indicates that one or more of the farthest edges of the conductive material of RDLs 26E/36E/40E may overlap one or more edges of package component 50. As such, thermal dissipation window 57C indicates a continuous region below package component 50 (e.g., overlapping some but not all of package component 50) that will be free of electrical activity.

Figure 9D:
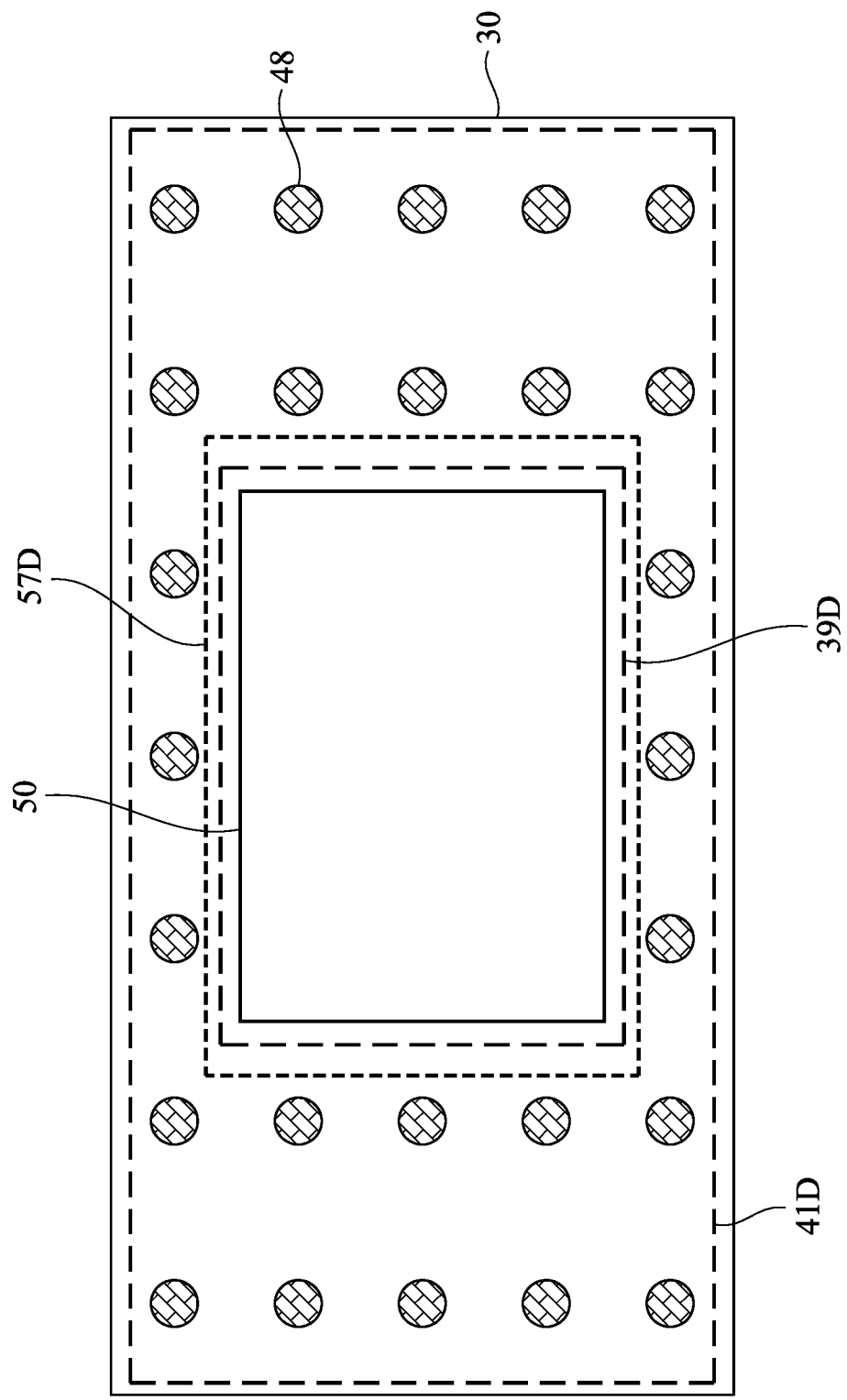

According to other layouts, FIG. 9D illustrates a plan view in which back-side interconnect structure 41D forms a ring around thermal dissipation block 39D, and metal posts 48 form a ring around package component 50. The dashed box for thermal dissipation block 39D indicates that the farthest edges of the conductive material of thermal dissipation features 26T/36T/40T may extend beyond some or all of the edges of package component 50.

Similarly, the dashed box for back-side interconnect structure 41D indicates that all of the farthest edges of the conductive material of RDLs 26E/36E/40E may not extend over edges of package component 50. As a result, a thermal dissipation window 57D indicates a continuous region below package component 50 (e.g., overlapping some or all of package component 50) that will be free of electrical activity. As illustrated, the continuous region of thermal dissipation window 57D has outer edges aligned with farthest internal edges of back-side interconnect structure 41D. In embodiments not specifically illustrated in which thermal dissipation block 39D does not extend beyond all edges of package component 50, thermal dissipation window 57D would still be as illustrated due to having outer edges aligned with internal edges of back-side interconnect structure 41D, as described above.

Figure 9E:
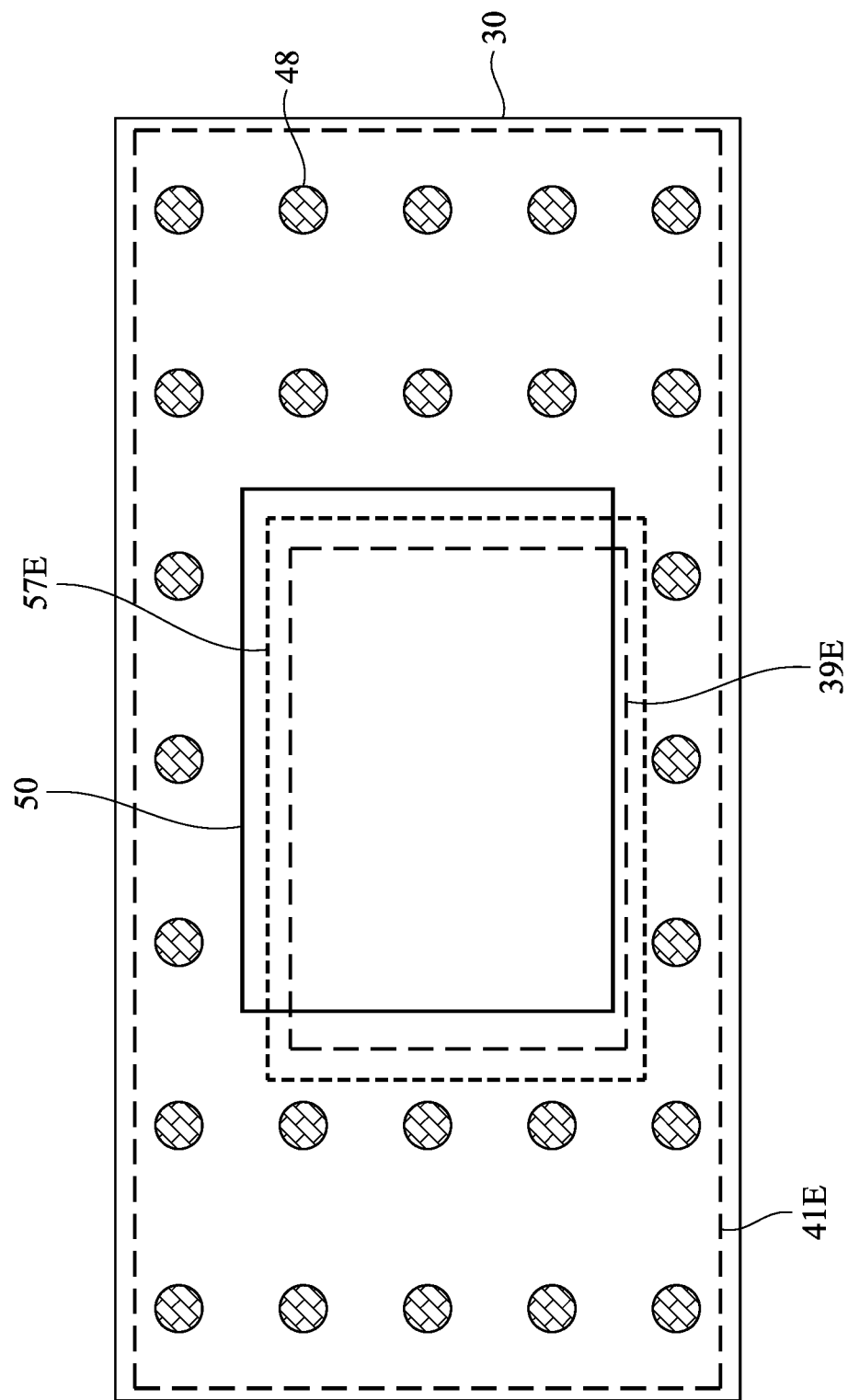

According to other embodiments, FIG. 9E illustrates a plan view in which back-side interconnect structure 41E forms a ring around thermal dissipation block 39E, and metal posts 48 form a ring around package component 50. The dashed box for thermal dissipation block 39E indicates that the farthest edges of the conductive material of thermal dissipation features 26T/36T/40T may extend beyond some and stay within some of the edges of package component 50.

The dashed box for back-side interconnect structure 41E indicates that one or more of the farthest edges of the conductive material of RDLs 26E/36E/40E may overlap one or more edges of package component 50. As such, thermal dissipation window 57E indicates a continuous region below package component 50 (e.g., overlapping some but not all of package component 50) that will be free of electrical activity.

As illustrated, thermal dissipation window 57E does not extend over an entirety of package component 50. In some embodiments not illustrated, thermal dissipation block 39E may stay entirely within the edges of package component 50, while back-side interconnect structure 41E may extend over entireties of all of the edges of package component 50 resulting in thermal dissipation window 57E being entirely within the edges of package component 50.

As illustrated in FIGS. 9B through 9E, thermal dissipation window 57 (e.g., thermal dissipation window 57B/C/D/E) may be less than a footprint of package component 50 or greater than the footprint of package component 50. In some embodiments, thermal dissipation window 57 may partially overlap with the footprint of package component 50. Further, in some embodiments and as illustrated, regions directly interposed between package component 50 and thermal dissipation block 39 (e.g., thermal dissipation block 39B/C/D/E) may be free of back-side interconnect structure 41 (e.g., RDLs 26E/36E/40E).

For example, in any of the described embodiments, thermal dissipation window 57 (e.g., the continuous region below and including a center point of package component 50 being free of back-side interconnect structure 41) may have rectangular dimensions of between about 50 µm by about 50 µm and about 1000 µm by about 1000 µm. In other embodiments, thermal dissipation window 57 may have rectangular dimensions of greater than about 1000 µm by about 1000 µm. In some embodiments, thermal dissipation window 57 may be overlapped by a majority (such as more than about 70%) of package component 50.

Figure 10:
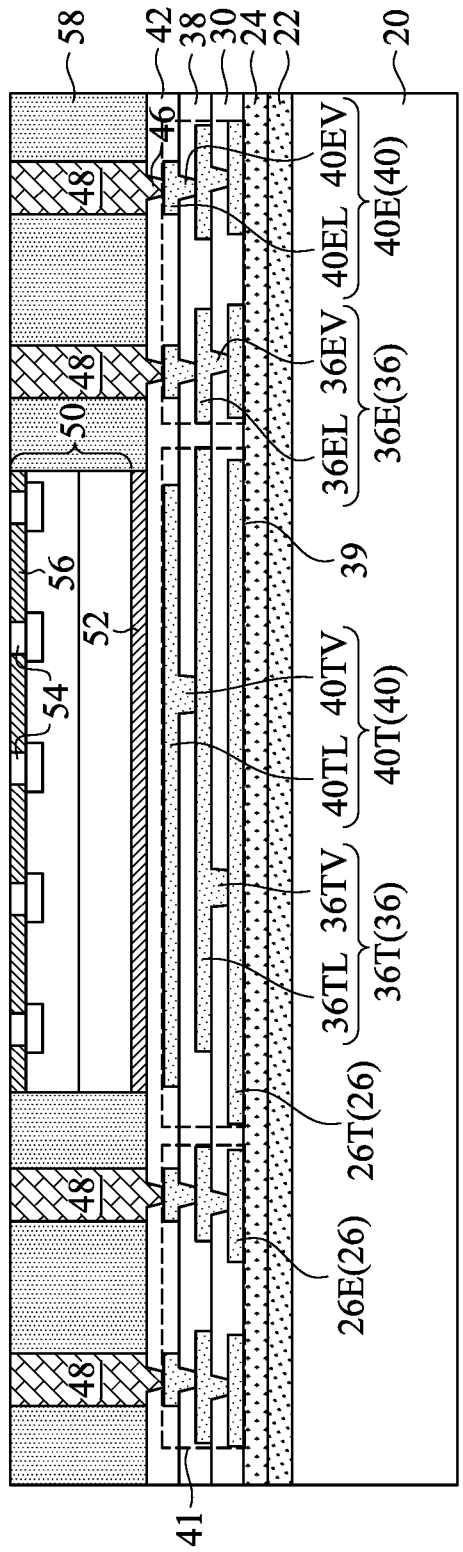

Next, encapsulant 58 is dispensed to encapsulate package component 50 and metal posts 48 therein, as shown in FIG. 10. The respective process is illustrated as process 224 in the process flow 200 shown in FIG. 19. Encapsulant 58 fills the gaps between neighboring metal posts 48 and the gaps between metal posts 48 and package component 50. Encapsulant 58 may include a molding compound, a molding underfill, an epoxy, and/or a resin. At the time of encapsulation, the top surface of encapsulant 58 is higher than the top ends of metal posts 48 and the top surfaces of package component 50. The molding compound may include a base material, which may be a polymer, a resin, an epoxy, or the like, and filler particles in the base material. The filler particles may be dielectric particles of silica, alumina, boron nitride, or the like, and may have spherical shapes. In a subsequent step, a planarization process such as a Chemical Mechanical Polish (CMP) process or a mechanical grinding process is performed to thin encapsulant 58 and package component 50, until both of electrical connectors 54 and metal posts 48 are revealed. Due to the planarization process, the top ends of electrical connectors 54 and metal posts 48 are level (coplanar) with the top surfaces of encapsulant 58. Metal posts 48 are alternatively referred to as metal posts 48 hereinafter since they penetrate through encapsulant 58.

Figure 11:
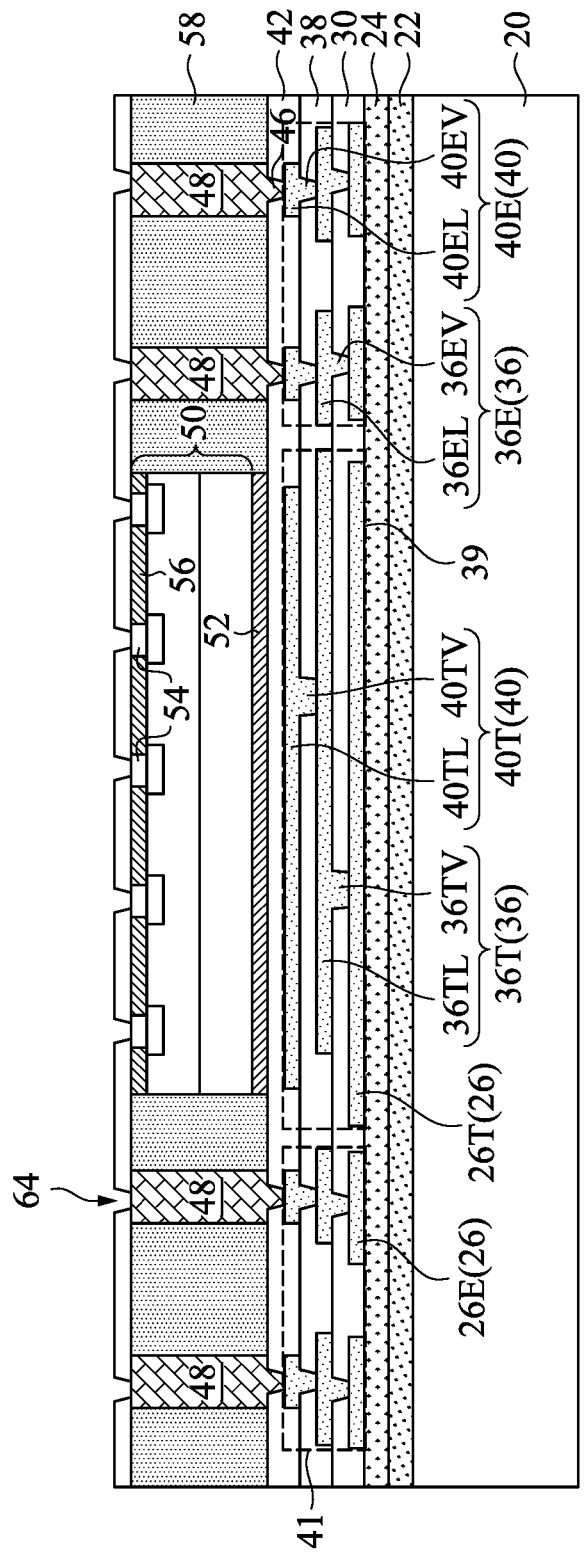
Figure 12:
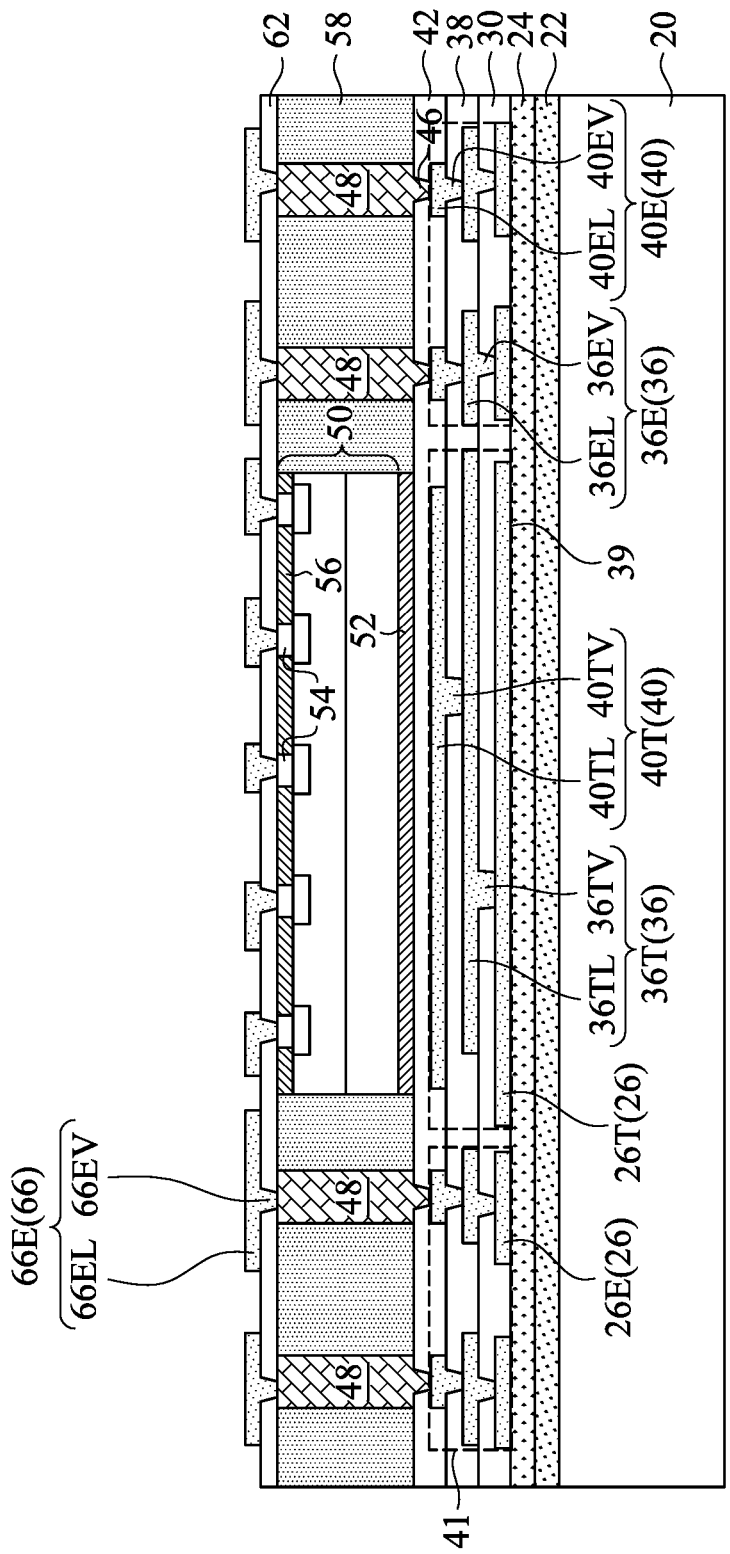
Figure 13:
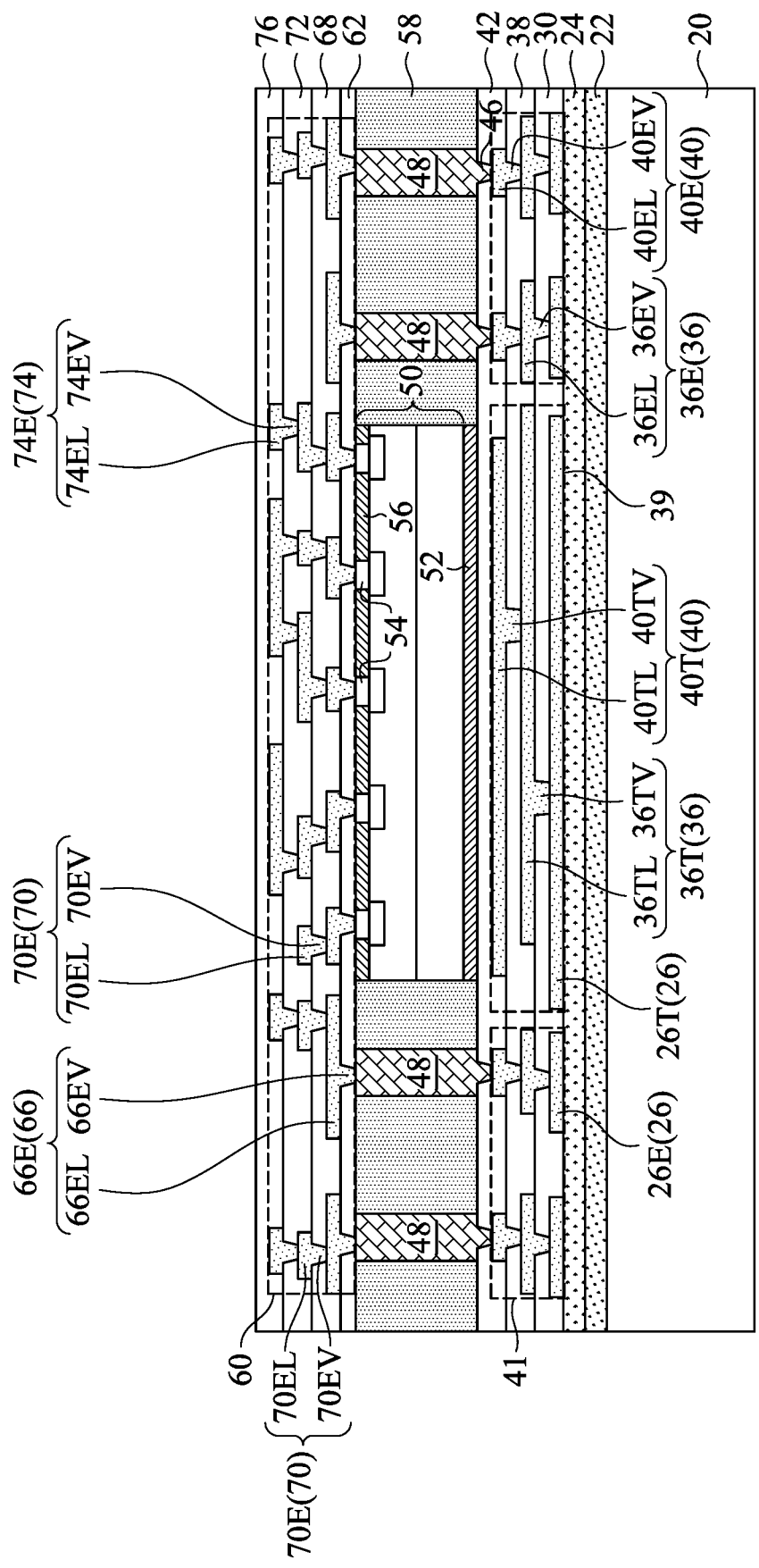

FIGS. 11 through 13 illustrate the formation of a front-side interconnect structure overlying and connecting to package component 50 and metal posts 48. FIGS. 11 and 12 illustrate the formation of a first layer of RDLs and the respective dielectric layer. Referring to FIG. 11, dielectric layer 62 is formed. In accordance with some embodiments of the present disclosure, dielectric layer 62 is formed of or comprises a polymer such as PBO, polyimide, BCB, or the like. The formation process includes coating dielectric layer 62 in a flowable form, and then curing dielectric layer 62. In accordance with alternative embodiments of the present disclosure, dielectric layer 62 is formed of an inorganic dielectric material such as silicon nitride, silicon oxide, or the like. The formation method may include CVD, Atomic Layer Deposition (ALD), Plasma-Enhanced Chemical Vapor Deposition (PECVD), or another applicable deposition method. Openings 64 are then formed, for example, through a photo lithography process. Metal posts 48 and electrical connectors 54 are exposed through openings 64.

Next, referring to FIG. 12, conductive features 66 are formed. Conductive features 66 include RDLs 66E, which are formed for electrical connection purpose. RDLs 66E may be formed similarly as the formation of the underlying conductive features 40 and 36. Each of the conductive features 66 may include a via portion and a line portion. For example, RDLs 66E may include line portions 66EL and the corresponding via portions (also referred to as vias) 66EV. Some of RDLs 66E may be electrically connected to metal posts 48, and others of RDLs 66E may be electrically connected to electrical connectors 54 of package component 50. For example, RDLs 66E that are electrically connected to an electrical connector 54 may be electrically connected to the electrical ground or a power supply voltage (such as VDD) of package component 50.

FIG. 13 illustrates the formation of dielectric layers 68, 72, and 76, and conductive features 70 and 74, which include RDLs 70E (including 70EL and 70EV) and 74E (including 74EL and 74EV), respectively. Some of RDLs 70E and 74E may be electrically connected to metal posts 48 through some of RDLs 66E, and others of RDLs 70E and 74E may be electrically connected to electrical connectors 54 of package component 50 through others of RDLs 66E. In accordance with some embodiments of the present disclosure, dielectric layers 68, 72, and 76 are formed of materials selected from the same group of candidate materials for forming dielectric layers 30 and 38, and may include organic materials or inorganic materials, as aforementioned. Throughout the description, conductive features 66, 70 and 74 are collectively referred to as front-side interconnect structure 60, which includes RDLs 66E, 70E, and 74E.

Figure 14:
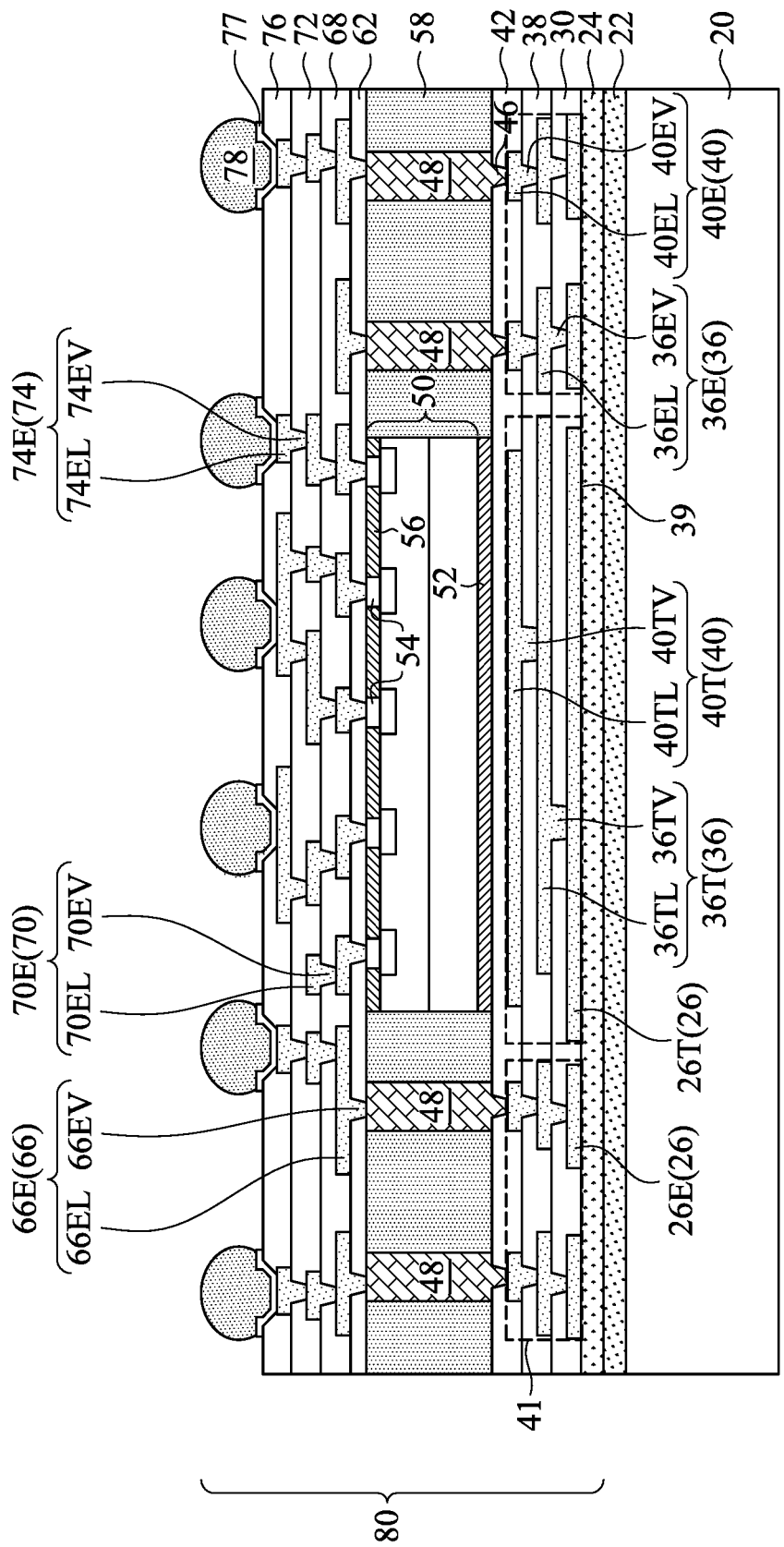

FIG. 14 illustrates the formation of Under-Bump Metallurgies (UBMs) 77, and electrical connectors 78 (e.g., external connectors or external electrical connectors) in accordance with some embodiments. The respective process is illustrated as process 228 in the process flow 200 shown in FIG. 19. To form UBMs 77, openings are formed in dielectric layer 76 to expose the underlying metal pads, which are parts of RDLs 74E in the illustrative embodiments. UBMs 77 may be formed of nickel, copper, titanium, or multi-layers thereof. UBMs 77 may include a titanium layer and a copper layer over the titanium layer.

Electrical connectors 78 are then formed on UBMs 77. The formation of electrical connectors 78 may include placing solder balls on the exposed portions of UBMs 77, and then reflowing the solder balls, and hence electrical connectors 78 are solder regions. In accordance with alternative embodiments of the present disclosure, the formation of electrical connectors 78 includes performing a plating process to form solder layers, and then reflowing the solder layers. Electrical connectors 78 may also include non-solder metal pillars, or metal pillars and solder caps over the non-solder metal pillars, which may also be formed through plating. Throughout the description, the structure over release film 22 is referred to as reconstructed wafer 80.

Figure 15:
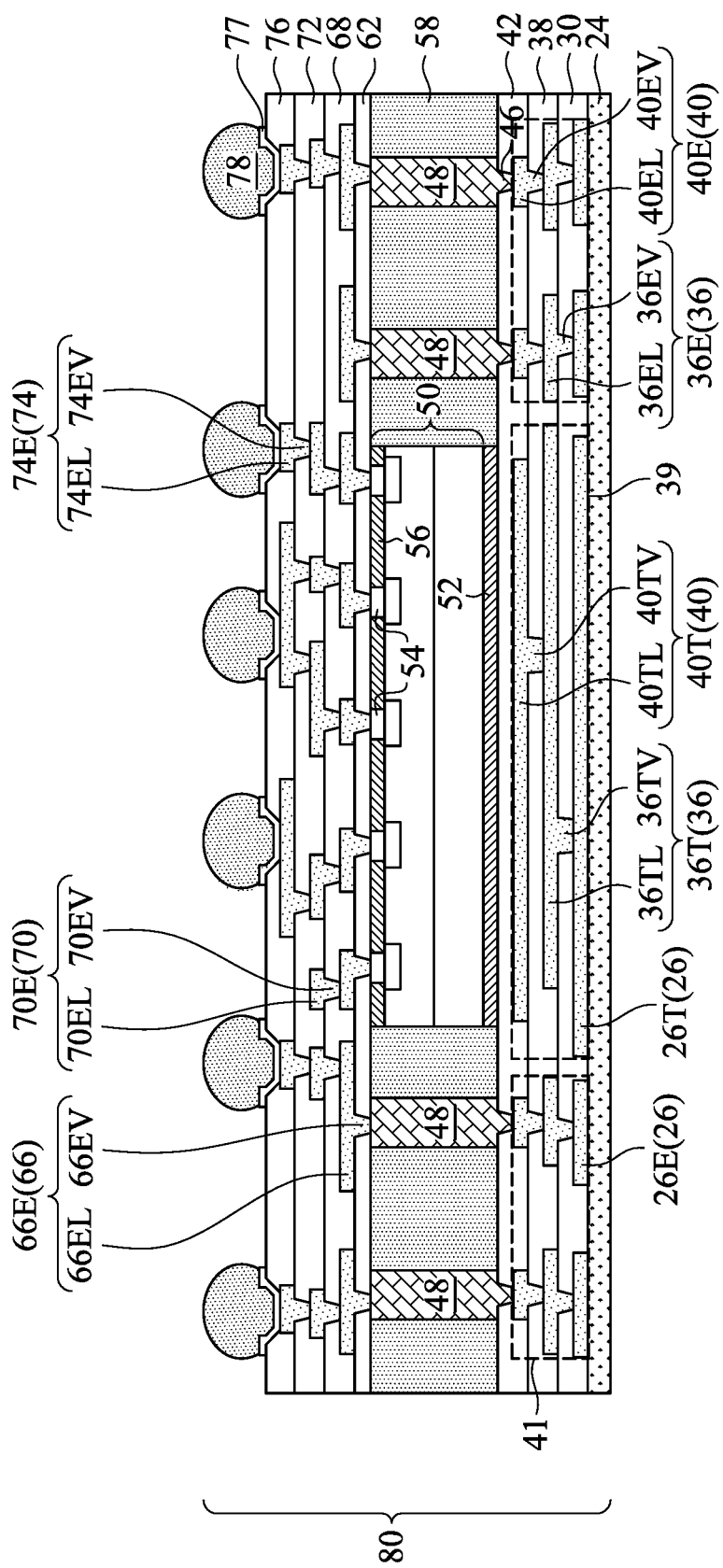
Figure 16A:
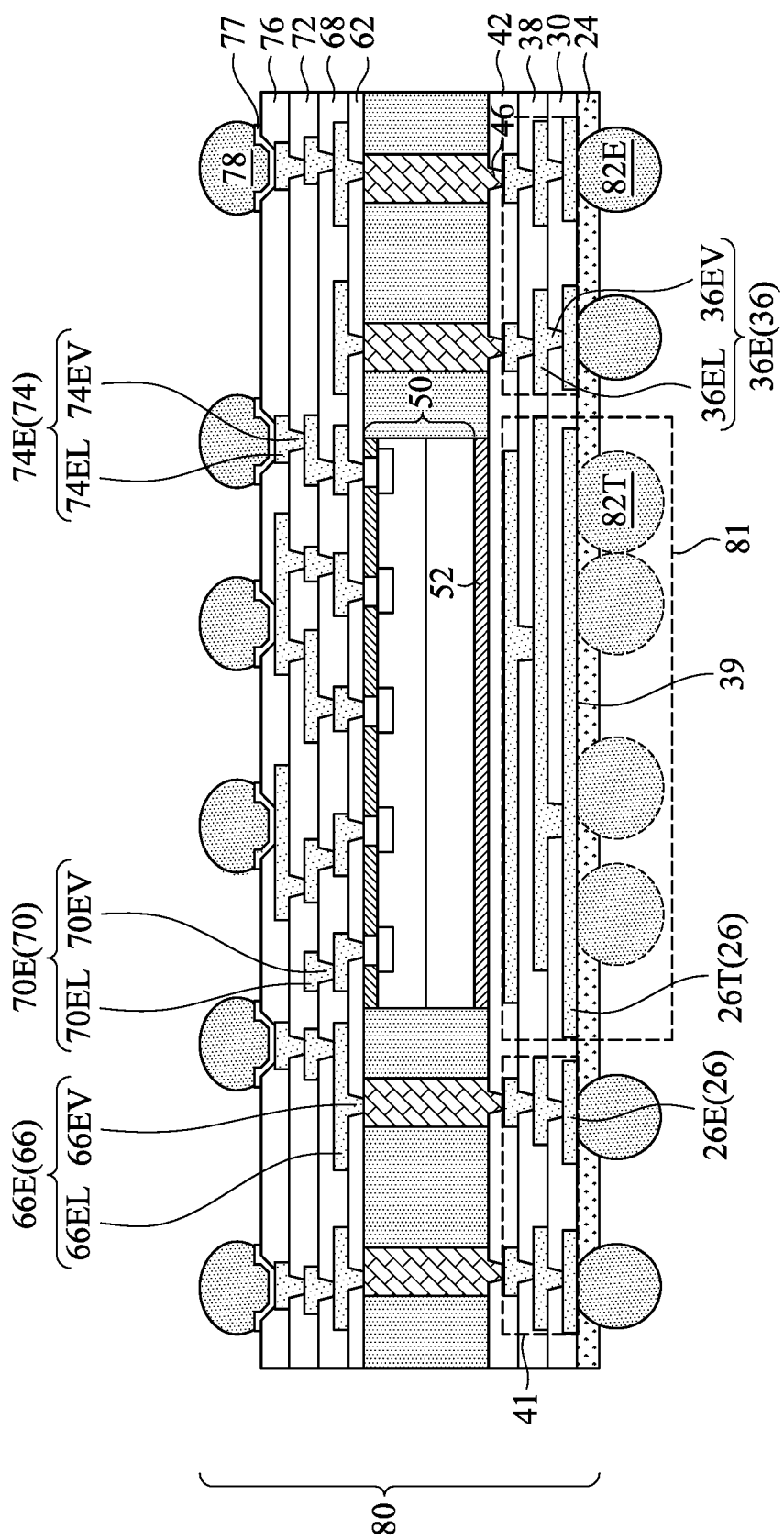
Figure 16B:
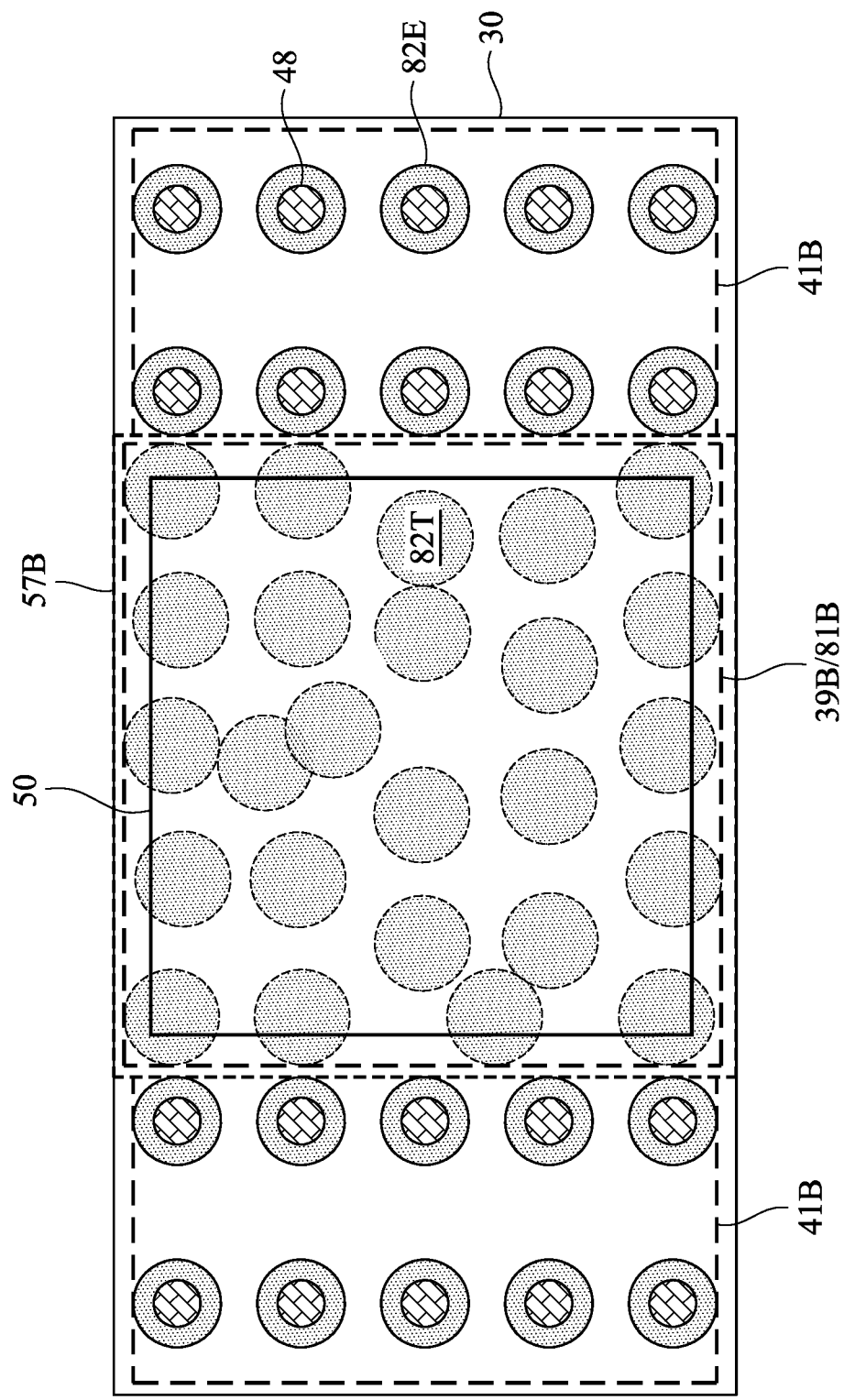
Figure 16C:
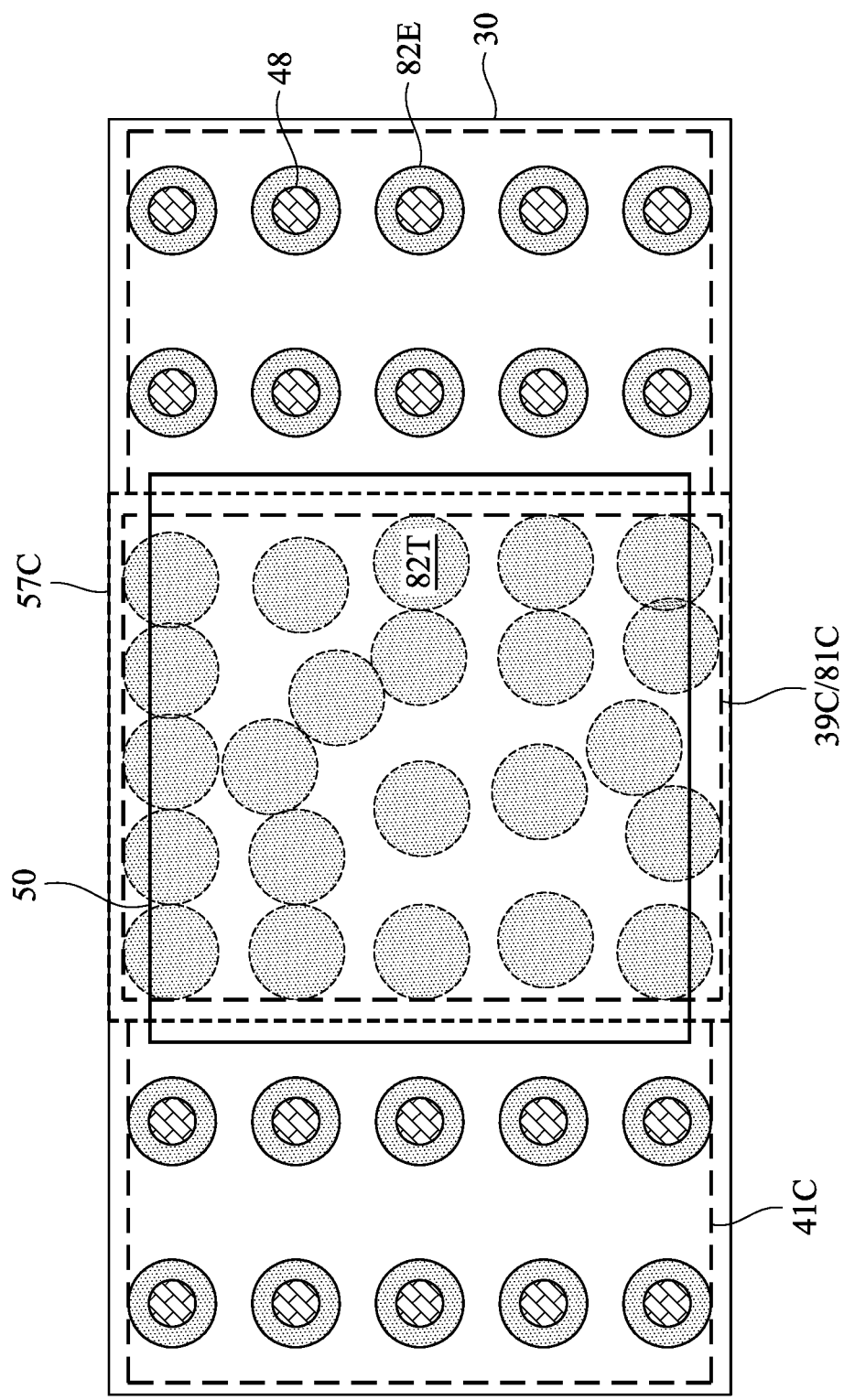
Figure 16D:
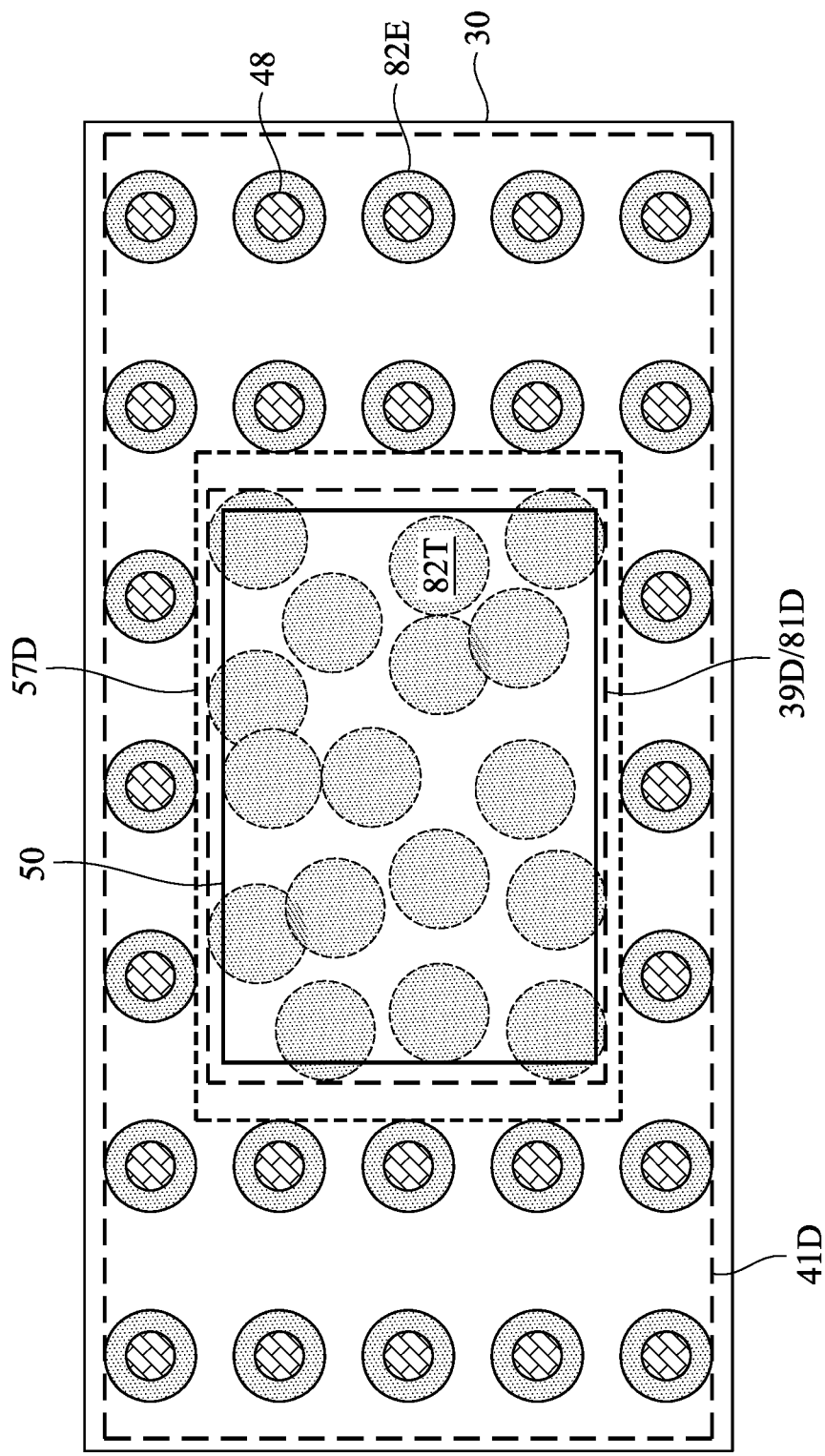
Figure 16E:
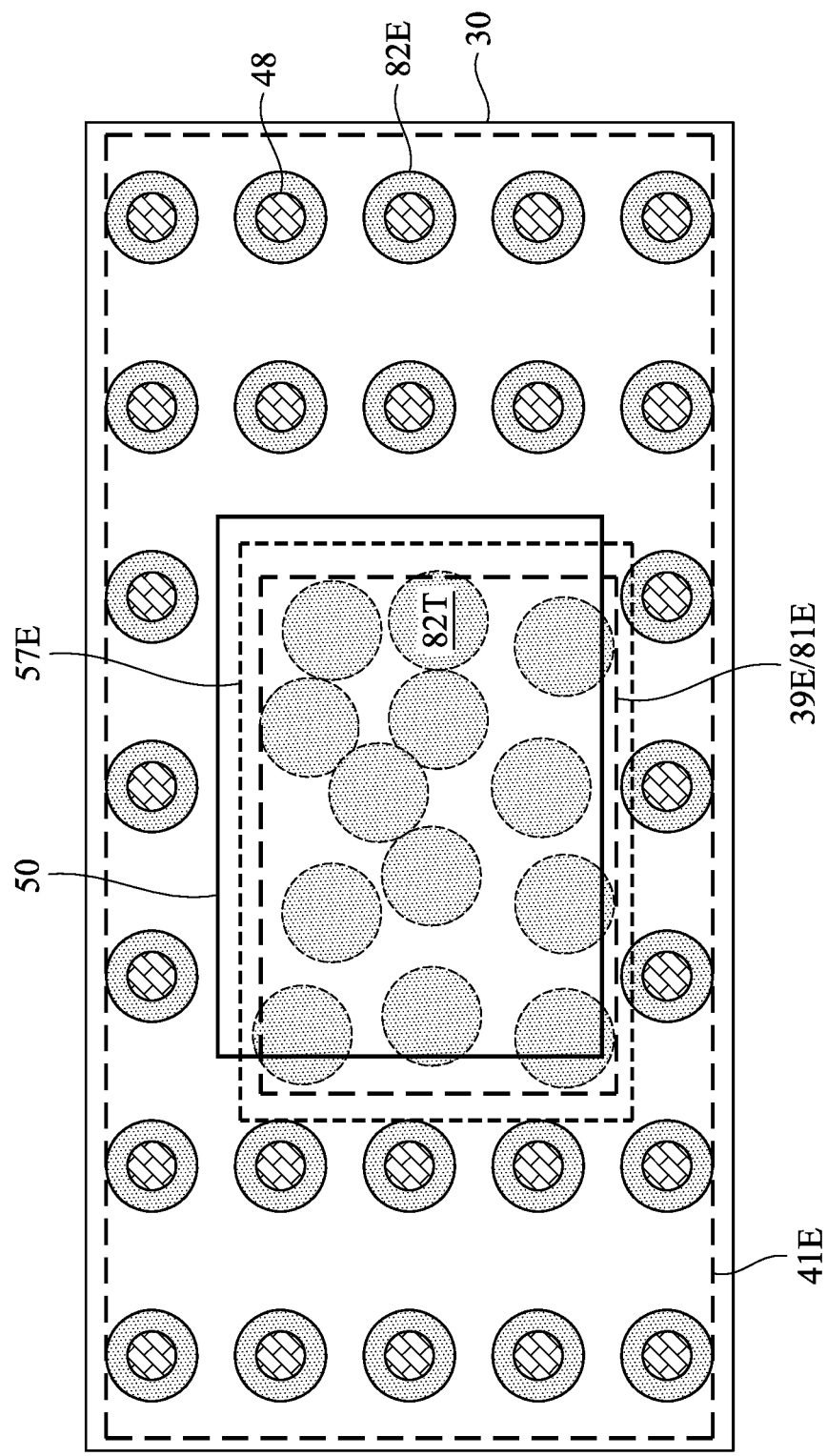

FIG. 15 illustrates the de-bonding of reconstructed wafer 80 from carrier 20. The respective process is illustrated as process 230 in the process flow 200 shown in FIG. 19. In accordance with some embodiments, a light beam (which may be a laser beam) is projected on release film 22, and the light beam penetrates through the transparent carrier 20. Release film 22 is thus decomposed. Carrier 20 may be lifted off from release film 22 and hence de-bonded (demounted) from carrier 20.

FIGS. 16A through 16E illustrate the formation of conductive connectors 82 or bumps penetrating through dielectric layer 24 to contact RDLs 26E and thermal dissipation features 26T, in accordance with various embodiments. The respective process is illustrated as process 232 in the process flow 200 shown in FIG. 19. In accordance with some embodiments, openings (occupied by conductive connectors 82) are formed in dielectric layer 24. The formation process may include a laser drill process performed using a laser beam, wherein RDLs 26E and thermal dissipation features 26T act as the stop layers for the laser drill. Some portions of RDLs 26E and thermal dissipation features 26T are exposed through the openings. Conductive connectors 82 are formed extending into the openings. In accordance with some embodiments, conductive connectors 82 are formed of or comprise solder. In accordance with alternative embodiments, conductive connectors 82 are formed of or comprise metal pads, metal pillars, or the like, and may or may not include solder.

In accordance with some embodiments, conductive connectors 82 comprise electrical connectors 82E and thermal dissipation connectors 82T. Electrical connectors 82E are formed to contact RDLs 26E, and thermal dissipation connectors 82T are formed to contact thermal dissipation features 26T (e.g., connected to thermal dissipation block 39). Thermal dissipation connectors 82T are illustrated using dashed lines to indicate that they may be formed in a greater variety of locations because they are dummy features that will not used for conducting current (e.g., electrical routing). As a result, thermal dissipation connectors 82T provide further ability to conduct heat away from heat-generating elements, such as package component 50.

Thermal dissipation block 39 (e.g., thermal dissipation features 26T/36T/40T) and thermal dissipation connectors 82T are collectively referred to as thermal dissipation block 81. Similarly, as with thermal dissipation block 39, thermal dissipation block 81 has edges aligned with the farthest edges of the conductive material of thermal dissipation features 26T/36T/40T as well as the farthest points of the conductive material of thermal dissipation connectors 82T. As such, thermal dissipation block 81 may have the same (or substantially the same) lateral dimensions as or extend farther laterally than thermal dissipation block 39.

FIGS. 16B through 16E illustrate the exemplary embodiments and layouts described above in connection with FIGS. 9B through 9E, respectively. Similarly, portions of back-side interconnect structure 41 and electrical connectors 82E may border opposing sides of thermal dissipation block 81. Thermal dissipation window 57 (e.g., thermal dissipation window 57B/C/D/E) indicates a region below package component 50 (e.g., within dielectric layers 30/38/42 and around conductive connectors 82) that is electrically isolated from back-side interconnect structure 41 and electrical connectors 82E. As a result, thermal dissipation window 57 indicates a region that will be free of electrical routing or other activity (e.g., electrical signals, power, or ground) in the completed semiconductor package.

As illustrated, thermal dissipation connectors 82T may laterally extend to up to about the same dimensions or to lesser dimensions as thermal dissipation block 39. As noted above, thermal dissipation block 81 has substantially the same lateral dimensions as thermal dissipation block 39. Similarly, electrical connectors 82E may laterally extend to up to about the same dimensions or to lesser dimensions as back-side interconnect structure 41. As a result, lateral dimensions of thermal dissipation window 57 are substantially unaffected by electrical connectors 82E.

As further illustrated in FIGS. 16A through 16E, each thermal dissipation connector 82T may be about the same size as or larger than each electrical connector 82E. For example, each thermal dissipation connector 82T may have a lateral diameter of between about 2 μm and about 500 μm, and each electrical connector 82E may have a lateral diameter of between about 2 μm and about 500 μm. In some embodiments, thermal dissipation connectors 82T may include a variety of sizes. In addition, thermal dissipation connectors 82T may have a smaller pitch than that for electrical connectors 82E. For example, thermal dissipation connectors 82T may have a pitch of between about 2 μm and about 500 μm, and electrical connectors 82E may have a pitch of between about 2 μm and about 500 μm. In some cases, some thermal dissipation connectors 82T may be in physical contact (e.g., shorted) with one another.

Further, while electrical connectors 82E may be formed in a grid-like pattern, thermal dissipation connectors 82T may also be formed in a grid-like pattern or else may be formed in a scattered pattern such that adjacent thermal dissipation connectors 82T include a variety of pitches (e.g., spacing from one another). In other words, even among adjacent thermal dissipation connectors 82T along a line, adjacent pairs of those thermal dissipation connectors 82T may have different distances from one another. In some embodiments, among all adjacent pairs of thermal dissipation connectors 82T there may be more than three different distances between one another. In other embodiments, thermal dissipation connectors 82T may be formed to match the pattern of thermal dissipation features 26T, which may include spaces between some or each of the adjacent pairs of thermal dissipation features 26T.

Additionally, although conductive connectors 82 are illustrated as being round, conductive connectors 82 may have any variety of shapes and designs. For example, conductive connectors may be round pillars, semi-ellipsoids, hemispheres (e.g., with the flat surface proximal to conductive features 26), spheres, combinations thereof, or the like. In some embodiments, electrical connectors 82E may be formed with one of the above shapes, while thermal dissipation connectors 82T may be formed with a different one of the above shapes.

In other embodiments not specifically illustrated, some or all of thermal dissipation connectors 82T are not formed in FIGS. 16A through 16E. For example, large spaces may be formed between thermal dissipation connectors 82T or an entire lower surface of thermal dissipation block 39 remains free of thermal dissipation connectors 82T until a subsequent step of attaching package component 84 (see FIGS. 17A through 17G).

FIGS. 17A through 17G illustrate the bonding of package component 84 to reconstructed wafer 80 through conductive connectors 82, in accordance with various embodiments. Package component 84 may be a 3D integrated circuit (3DIC) package, an integrated circuit fan-out (InFO) package, the like, or any suitable package. In particular, package component 84 may further dissipate heat from the heat-generating elements (e.g., package component 50) by receiving heat from thermal dissipation block 81 (e.g., directly from thermal dissipation connectors 82T). In some embodiments, package component 84 may generate less heat during use of the completed semiconductor package than other heat-generating elements such as package component 50.

Figure 19:
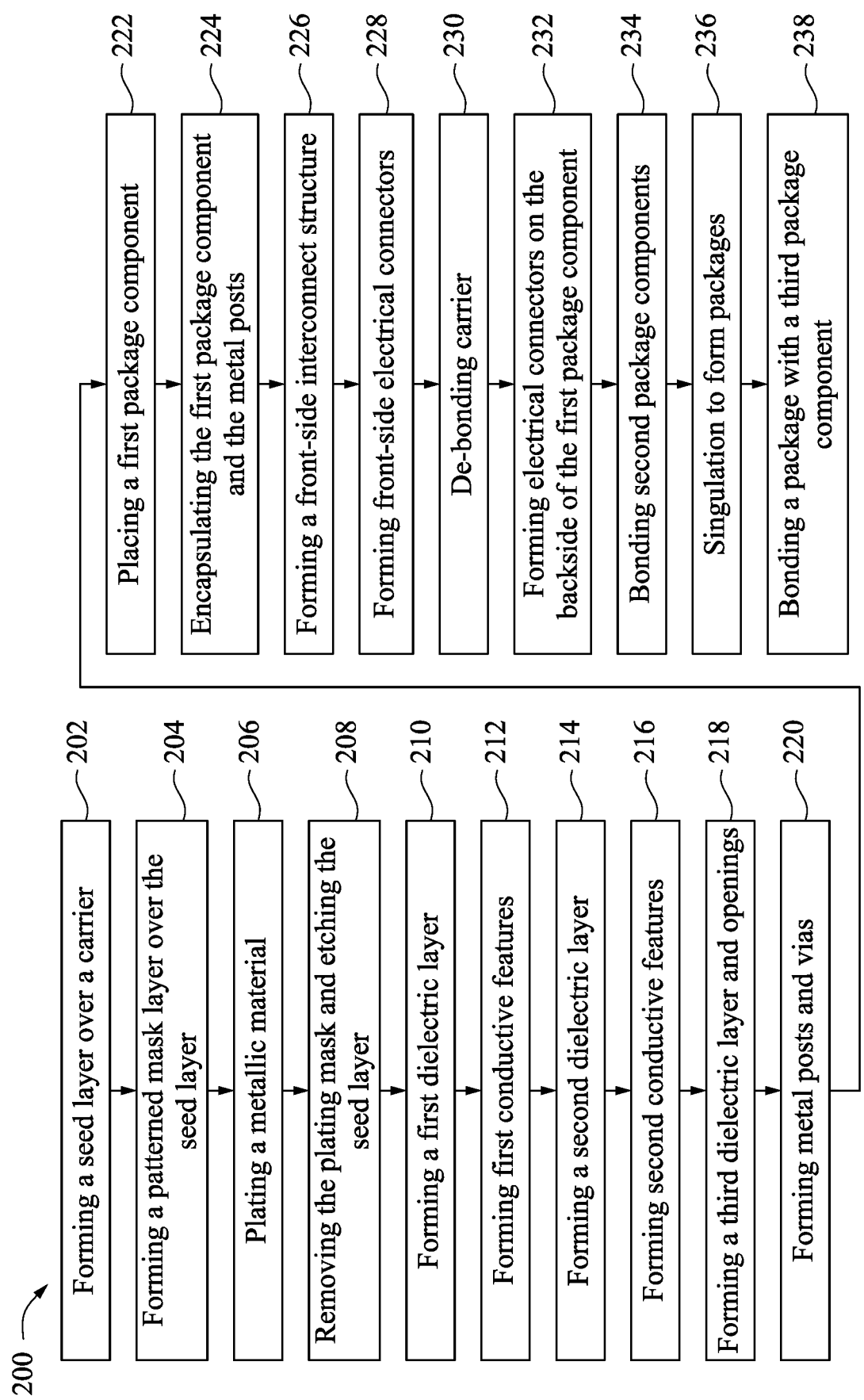
FIG. 19 illustrates a process flow for forming a package including thermal dissipation elements in accordance with some embodiments.

The respective process is illustrated as process 234 in the process flow 200 shown in FIG. 19. Although one package component 84 is illustrated, there may be a plurality of identical package components 84 bonded to reconstructed wafer 80. In accordance with some embodiments, package component 84 is a device die, a stack of device dies, a package, or the like. Underfill 86 may be dispensed between package component 84 and reconstructed wafer 80.

Package component 84 may include a device die, a package with a device die(s) packaged therein, a System-on-Chip (SoC) die including a plurality of integrated circuits (or device dies) integrated as a system such as a 3DIC, or the like. Each of the device dies in package component 84 may be or may comprise a logic die, a memory die, an input-output die, an Integrated Passive Device (IPD), or the like, or combinations thereof. For example, the logic die in package component 84 may be a Central Processing Unit (CPU) die, a Graphic Processing Unit (GPU) die, a mobile application die, a Micro Control Unit (MCU) die, a Base-Band (BB) die, an Application processor (AP) or Application-Specific integrated circuit (ASIC) die, or the like. The memory die in package component 84 may include a Static Random Access Memory (SRAM) die, a Dynamic Random Access Memory (DRAM) die, or the like.

In accordance with some embodiments, package component 84 is a package comprising one or more dies 120A/B embedded in molding compound 124 and disposed over substrate 122. Substrate 122 may be an interposer used as an intermediate substrate to connect dies 120A/B to conductive connectors 82. In some embodiments, substrate 122 may include a silicon substrate, doped or undoped, or an active layer of a silicon-on-insulator (SOI) substrate. However, substrate 122 may also be a glass substrate, a ceramic substrate, a polymer substrate, or any other substrate that may provide a suitable protection and/or interconnection functionality. These and any other suitable materials may be used for substrate 122. In other embodiments, substrate 122 may comprise one or more dielectric layers comprising material similar to that used in dielectric layers 30/38/42, such as being formed of a nitride such as silicon nitride, or an oxide such as silicon oxide, PSG, BSG, BPSG, FSG, or the like.

Substrate 122 may include conductive features 132 embedded or formed within or through the interposer or in the one or more dielectric layers. Conductive features 132 may include RDLs 132E and thermal conductive features 132T. For example, conductive features 132 may form an interconnect structure, such as being similar to back-side interconnect structure 41 and/or front-side interconnect structure 60. RDLs 132E are formed for electrical connection, such as for connecting electrical connectors 82E to dies 120A/B through wiring 128. Although in the illustrated view only one electrical connector 82E is shown to be connected to RDLs 132E, more or all of other electrical connectors 82E may also be connected to respective non-illustrated RDLs 132E and ultimately connected to one or more of dies 120A/B.

Figure 17A:
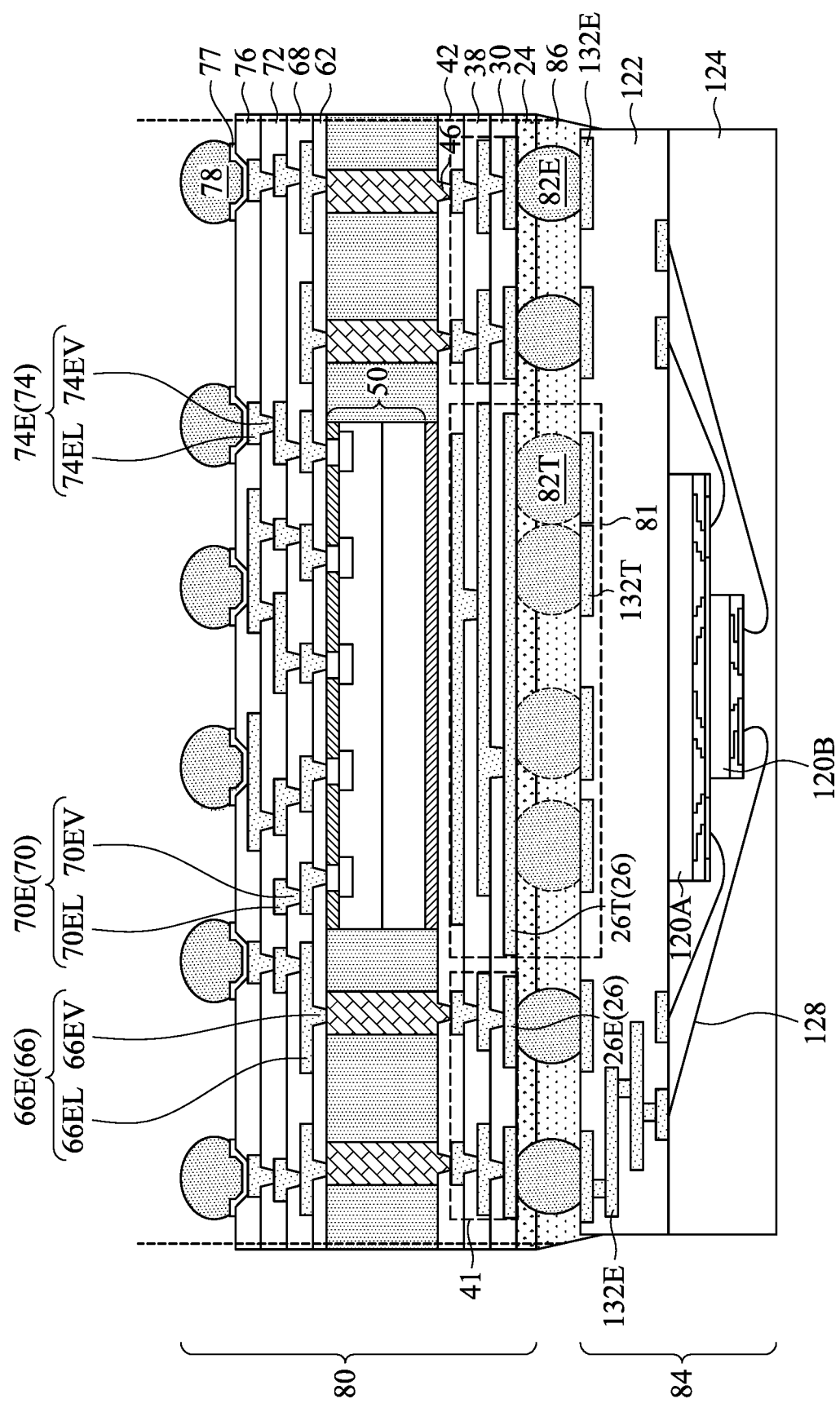

In FIG. 17A, thermal dissipation features 132T may be embedded in the dielectric material of substrate 122 and in contact with thermal dissipation connectors 82T. As illustrated, thermal dissipation features 132T may be located along the surface of substrate 122 adjacent to underfill 86. The illustrated thermal dissipation features 132T and thermal dissipation block 81 are electrically isolated from back-side interconnect structure 41, RDLs 132E, and dies 120A/B. As a result, thermal dissipation features 132T will be free of electrical activity (e.g., electrically floating) and provide further heat dissipation from heat-generating elements, such as package component 50. Heat may dissipate from thermal dissipation features 132T to, for example, the dielectric material of substrate 122, thereby facilitating improved heat dissipation by the elements of thermal dissipation block 81.

Figure 17B:
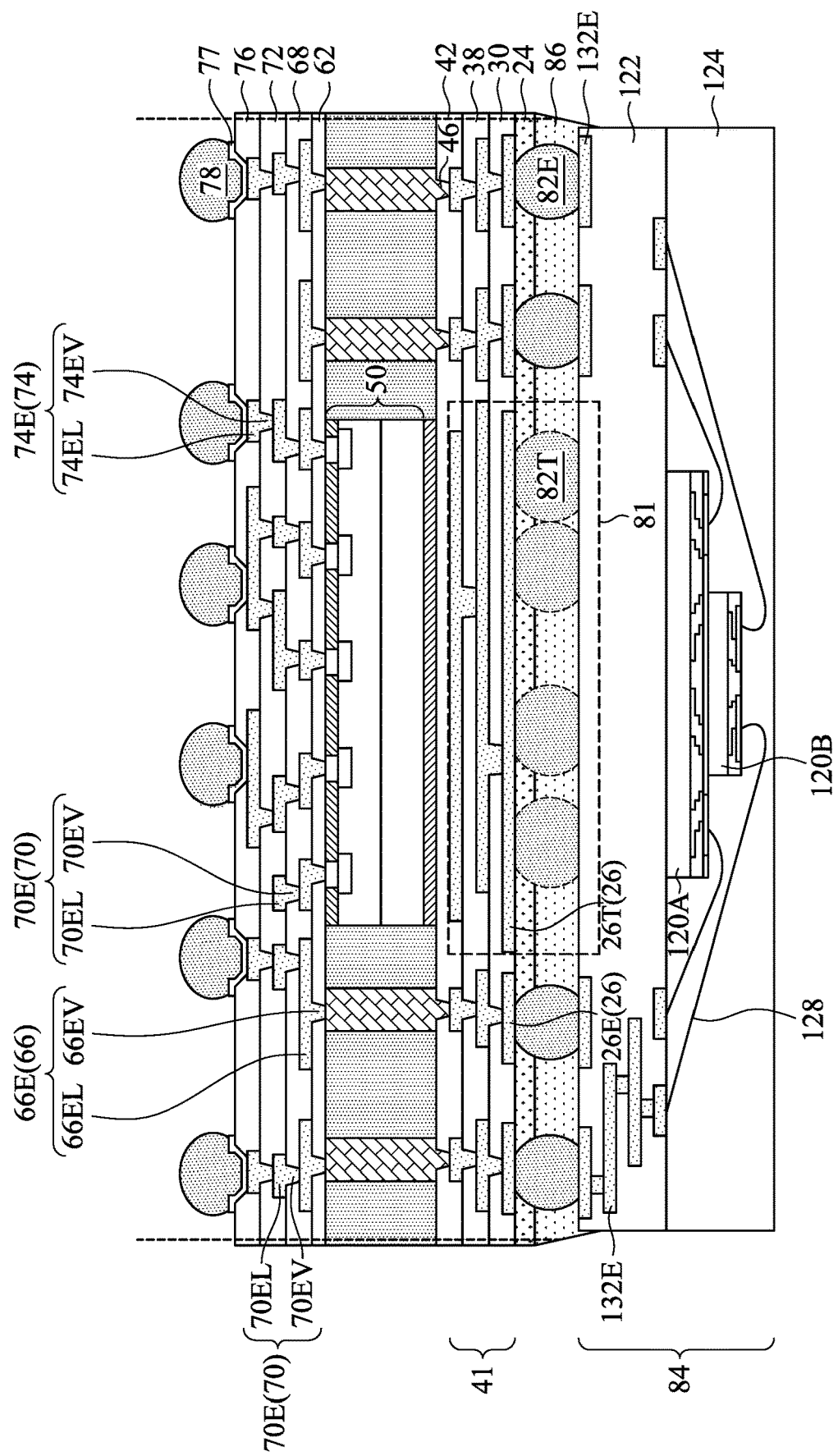

In FIG. 17B, substrate 122 may be free of thermal dissipation features 132T and, therefore, thermal dissipation connectors 82T may be in contact with the dielectric material of substrate 122. As a result, substrate 122 directly facilitates heat dissipation from heat-generating elements, such as package component 50, through thermal dissipation block 81. Although not specifically illustrated, in other embodiments, substrate 122 may include some thermal dissipation features 132T in contact with some of thermal dissipation connectors 82T, while others of thermal dissipation connectors 82T are in contact with the dielectric material of substrate 122.

Figure 17C:
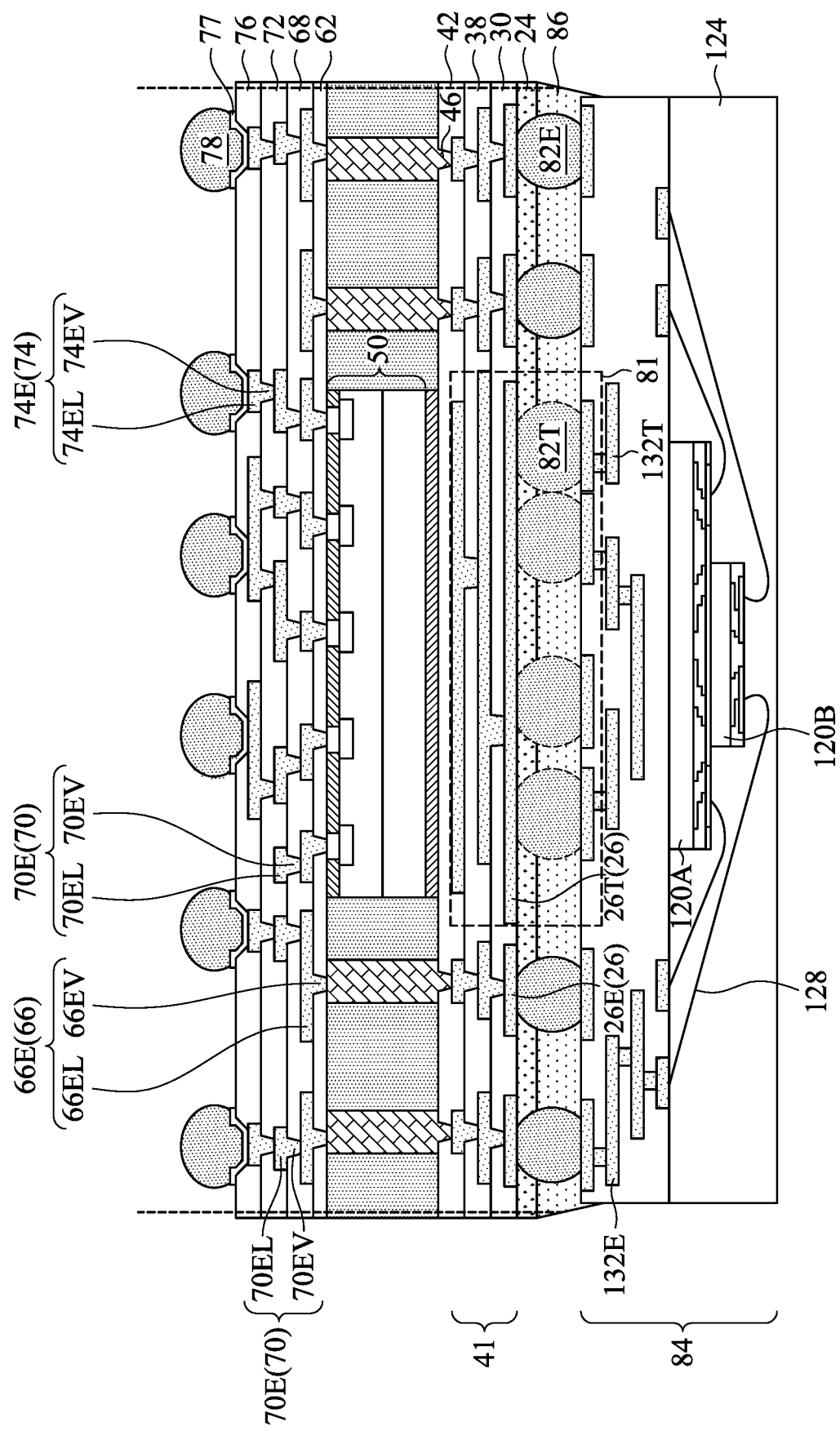

In FIG. 17C, thermal dissipation features 132T may include a plurality of layers embedded in the dielectric material of substrate 122 and in contact with thermal dissipation connectors 82T. In addition, thermal dissipation features 132T may be located at the surface of substrate 122 adjacent to underfill 86 and extend toward but stopping short of dies 120A/B and molding compound 124. As a result, thermal dissipation features 132T may facilitate enhanced heat dissipation from heat-generating elements as compared to the heat dissipation in embodiments described above.

Figure 17D:
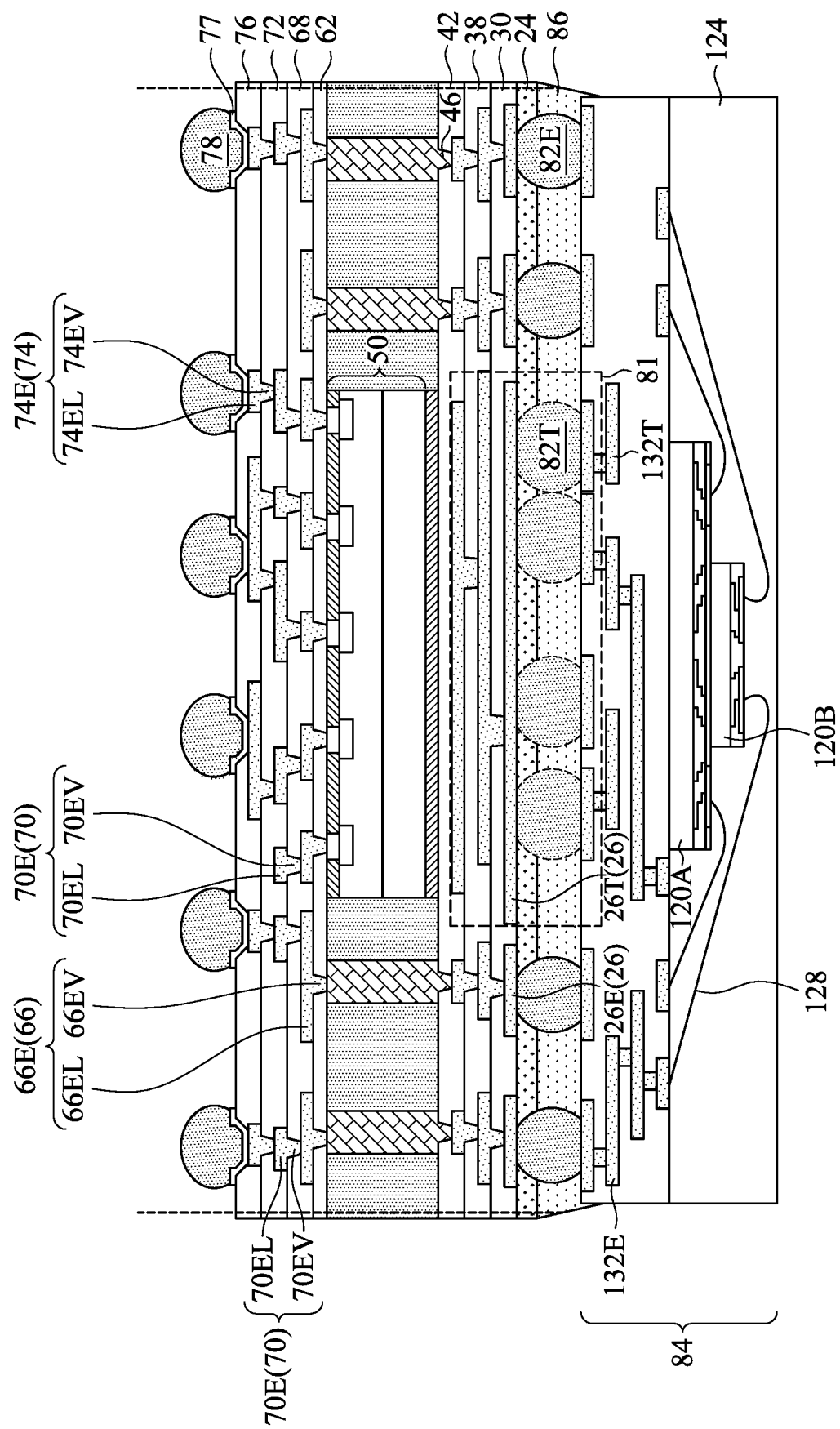

In FIG. 17D, thermal dissipation features 132T may include a plurality of layers embedded in the dielectric material of substrate 122 and in contact with thermal dissipation connectors 82T, similarly as above. In addition, thermal dissipation features 132T may be located at the surface of substrate 122 adjacent to underfill 86 and extend to reach molding compound 124. As a result, thermal dissipation features 132T may facilitate further enhanced heat dissipation from heat-generating elements, such as package component 50. For example, heat may dissipate from thermal dissipation block 81 through thermal dissipation features 132T to the dielectric material of substrate 122 as well as to molding compound 124.

Figure 17E:
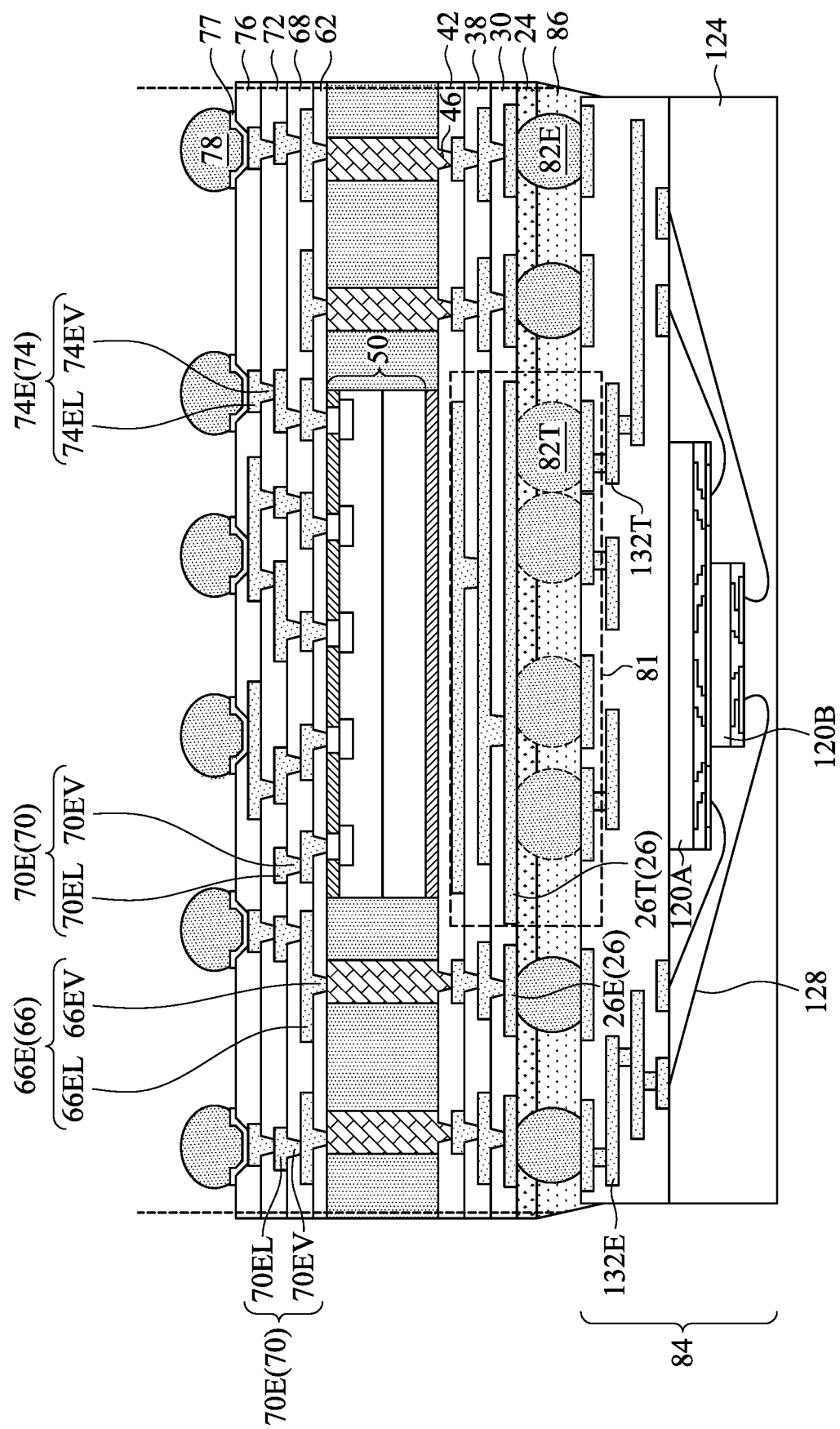

In FIG. 17E, thermal dissipation features 132T may include one or more layers embedded in the dielectric materials of substrate 122 and in contact with thermal dissipation connectors 82T, similarly as above. In addition, thermal dissipation features 132T may be located at the surface of substrate 122 adjacent to underfill 86 and extend laterally toward lateral edges of substrate 122. In embodiments in which package component 84 is a wafer, thermal dissipation features 132T extend laterally through substrate 122 toward scribe regions of substrate 122 (e.g., where lateral edges of substrate 122 will be after subsequent singulation). For example, thermal dissipation features 132T may be a distance away from lateral edges or scribe lines of substrate 122 of between about 2 μm and about 50 μm. As a result, thermal dissipation features 132T may facilitate further enhanced heat dissipation from heat-generating elements, such as package component 50. For example, heat may dissipate from thermal dissipation block 81 through thermal dissipation features 132T to the dielectric material of substrate 122, including to lateral edges of substrate 122 that may be in contact with other heat dissipating material in a final semiconductor package or device. For example, the other heat dissipating material might simply be air.

Figure 17F:
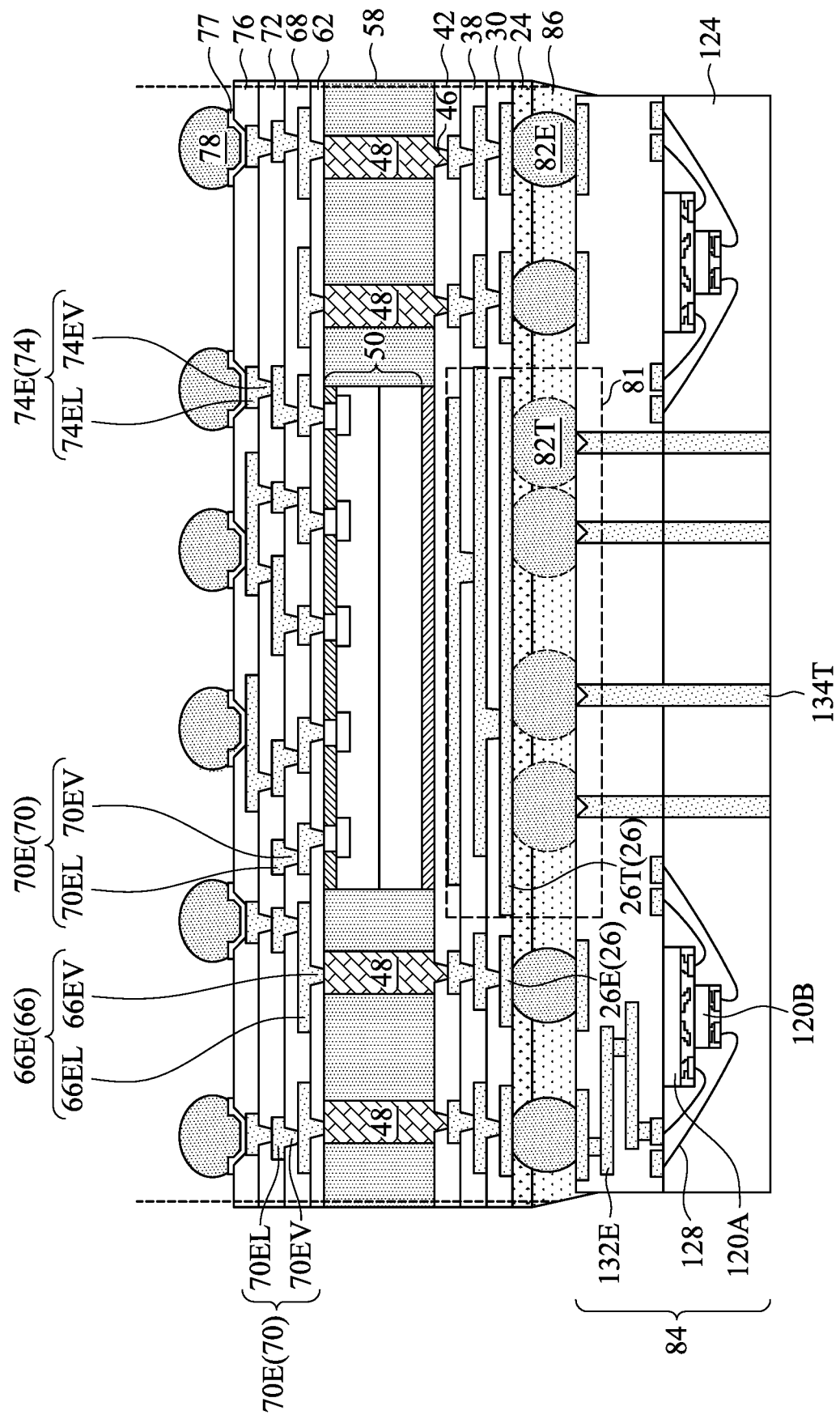

In FIG. 17F, package component 84 may include some or all of thermal dissipation features 132T according to embodiments described above in connection with FIGS. 17A/C/D/E or be free of thermal dissipation features 132T as described above in connection with FIG. 17B. In addition, substrate 122 may include thermal through-package vias 134T extending through the dielectric material of substrate 122 and molding compound 124. Thermal through-package vias 134T may be in contact with some or all of thermal dissipation connectors 82T. As a result, thermal through-package vias 134T provide heat dissipation from heat-generating elements, such as package component 50. For example, heat may dissipate from thermal dissipation block 81 through thermal through-package vias 134T to the dielectric material of substrate 122, to molding compound 124, and also to other potentially heat dissipating material in a final semiconductor package or device. For example, similarly as above, the other heat dissipating material might simply be air.

Although not specifically illustrated, package component 84 may contain any combinations of RDLs 132E, thermal dissipation features 132T, and thermal through-package vias 134T described above. For example, some thermal dissipation connectors 82T may be in contact with only the dielectric material of substrate 122 (see FIG. 17B), other thermal dissipation connectors 82T may be in contact with thermal dissipation features 132T that are only along the surface of the substrate (see FIG. 17A), and yet others of thermal dissipation connectors 82T may be in contact with thermal dissipation features 132T that extend downward and/or laterally through the dielectric material of substrate 122. Similarly, as discussed above with thermal dissipation features 26T/36T/40T of thermal dissipation block 39 (see FIGS. 9A through 9E), thermal dissipation features 132T are electrically isolated from electrical signal routing laterally (e.g., electrically isolated from RDLs 132E) and below (e.g., electrically isolated from dies 120A/B). As such, thermal dissipation features 132T may also be referred to as dangling or electrically dangling.

Figure 17G:
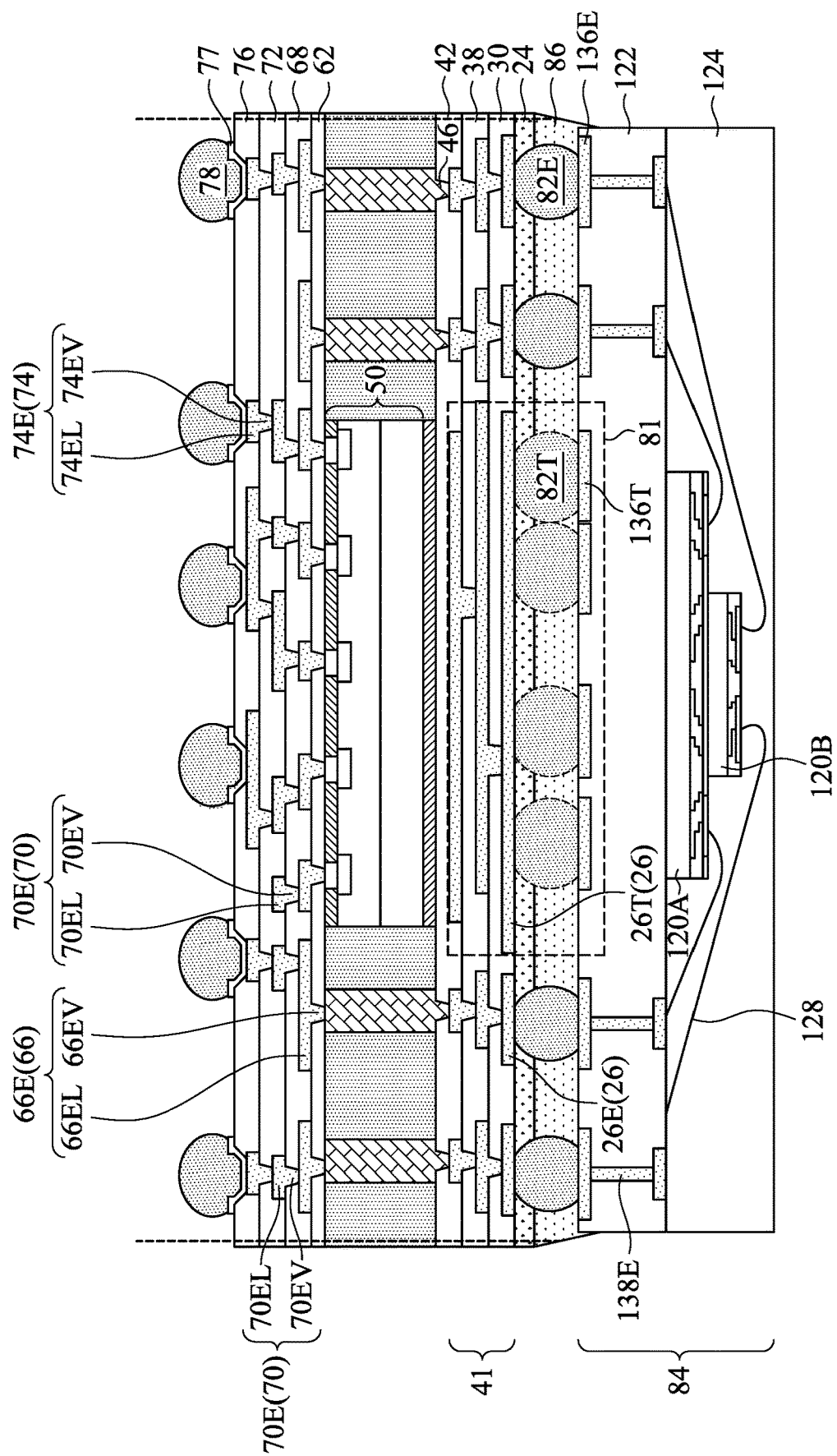

In FIG. 17G, substrate 122 of package component 84 comprises contact pads 136, which includes electrical contact pads 136E and, optionally, thermal dissipation pads 136T. In some embodiments, substrate 122 may be a packaging substrate comprising internal interconnects (e.g., through substrate vias 138E) to connect electrical connectors 82E and contact pads 136E to dies 120A/B. Similarly, as in FIG. 17A, thermal dissipation pads 136T in contact with thermal dissipation connectors 82T may provide further heat dissipation from thermal dissipation block 81. Thermal dissipation pads 136T may not be further electrically connected laterally or below and, therefore, may be referred to as dangling.

In some embodiments with respect to FIGS. 17A through 17G, some or all of thermal dissipation connectors 82T may be formed along substrate 122 (e.g., along thermal dissipation features 132T and/or thermal dissipation pads 136T) before attaching package component 84 using the methods, materials, and dimensions described above in connection with FIGS. 16A through 16E. As such, the resulting thermal dissipation connectors 82T after attachment of package component 84 may have one or more of three variations. In a first variation, some or all of thermal dissipation connectors 82T may have been originally formed along reconstructed wafer 80, some or all of thermal dissipation connectors 82T may have been originally formed along package component 84, and some or all of thermal dissipation connectors 82T may include one portion formed along reconstructed wafer 80 coming into contact and bonding with another portion formed along package component 84 during attachment of package component 84. For example, in some embodiments, electrical connectors 82E may be originally formed along reconstructed wafer 80 while thermal dissipation connectors may be originally formed along package component 84.

Next, the structure is placed on a dicing tape (not shown), which is attached to a frame (not shown). In accordance with some embodiments of the present disclosure, the structure is singulated in a die-saw process along scribe lines as indicated by the dashed lines along lateral sides, for example, using a blade, and is separated into discrete packages. The respective process is illustrated as process 236 in the process flow 200 shown in FIG. 19.

Figure 18:
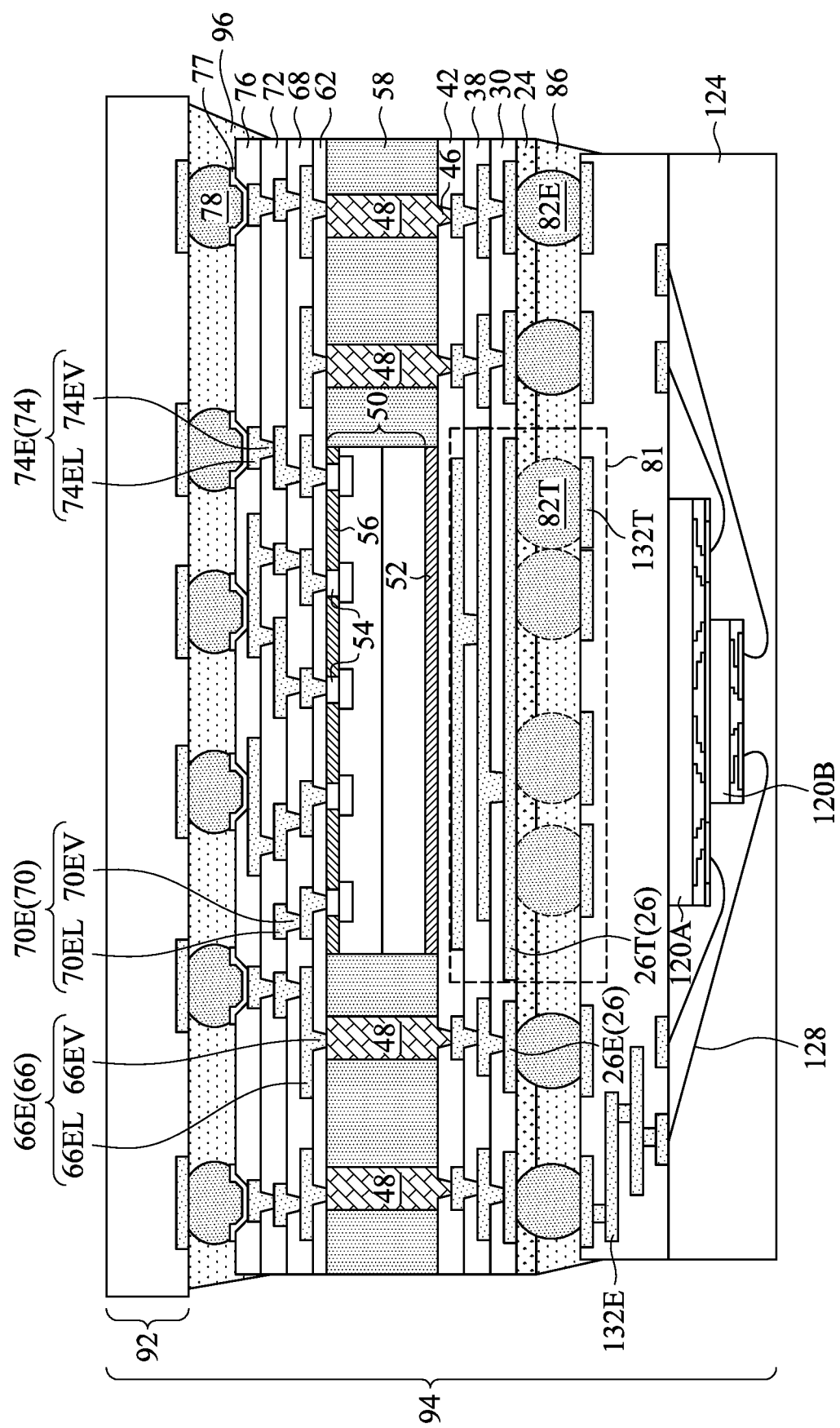

FIG. 18 illustrates the bonding of the structure with package component 92 to form the semiconductor package 94. The respective process is illustrated as process 238 in the process flow 200 shown in FIG. 19. In accordance with some embodiments, package component 92 is or comprises a package substrate, an interposer, another package, or the like. Underfill 96 may be dispensed into the gap below package component 92 and around electrical connectors 78. In some embodiments, package component 92 provides external electrical connection (e.g., an entirety of external electrical connection) to all signal routing elements of semiconductor package 94. For example, electrical connectors 78 may be configured to transmit some or all of the external electrical connection from package component 92 into the rest of semiconductor package 94.

In accordance with some embodiments, since thermal dissipation block 39, thermal dissipation connectors 82T, thermal dissipation features 132T, and thermal through-package vias 134T (any combinations of which collectively referred to as thermal dissipation elements) are formed of metallic materials, the thermal dissipation elements have higher thermal conductivity values than the dielectric layers in which the thermal dissipation elements are located. Accordingly, through the thermal dissipation elements, the heat generated by package component 50 may be conducted away more efficiently. Experimental results revealed that by adopting the embodiments of the present disclosure, the temperature of package component 50 may be significantly lowered. For example, during use of a version of semiconductor package 94 that excludes thermal dissipation block 39, a back surface of package component 50 (e.g., proximal to DAF 52) may have a temperature as high as 113° C. However, during use of semiconductor package 94 that includes thermal dissipation block 39, the temperature may be reduced to 103° C. Despite being formed of conductive materials, the thermal dissipation elements remain electrically isolated from electrical signal routing elements and from external electrical connection. As a result, the thermal dissipation elements are configured to provide no signal or transmitting in semiconductor package 94.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming thermal dissipation blocks as described, especially in conjunction with one or more of the other thermal dissipation elements described above, the heat generated by certain heat-generating elements, such as a device die, can be efficiently conducted away from those heat-generating elements and other package elements. The temperature of and around the heat-generating elements is thus reduced.

In an embodiment, a method of forming a semiconductor device includes forming a first interconnect structure over a carrier; forming a thermal dissipation block over the carrier; forming metal posts over the first interconnect structure; attaching a first integrated circuit die over the first interconnect structure and the thermal dissipation block; removing the carrier; attaching a semiconductor package to the first interconnect structure and the thermal dissipation block using first electrical connectors and thermal dissipation connectors; and forming external electrical connectors, the external electrical connectors being configured to transmit each external electrical connection into the semiconductor device, the thermal dissipation block being electrically isolated from each external electrical connection. In an embodiment, in a plan view the first interconnect structure forms a ring around the thermal dissipation block. In an embodiment, in a plan view the thermal dissipation block is free of the first interconnect structure, and wherein in the plan view the thermal dissipation block has dimensions of about 1000 µm and about 1000 µm. In an embodiment, the thermal dissipation block comprises: three layers of conductive lines; and conductive vias being interposed between adjacent pairs of the three layers of conductive lines. In an embodiment, the method further includes forming a second interconnect structure over and electrically connected to the metal posts and the first integrated circuit die; and forming second electrical connectors over the second interconnect structure. In an embodiment, the semiconductor package comprises: a second integrated circuit die embedded in a molding compound; a substrate adjacent to the molding compound; and a third interconnect structure embedded in the substrate, the third interconnect structure being electrically interposed between the second integrated circuit die and the first interconnect structure. In an embodiment, the semiconductor package further comprises thermal dissipation features, and wherein the thermal dissipation connectors physically contact the thermal dissipation block and the thermal dissipation features. In an embodiment, the thermal dissipation features extend from one side of the substrate to another side of the substrate.

In an embodiment, a semiconductor package includes a first conductive connector and a second conductive connector disposed over a first semiconductor package; a first conductive line disposed over and electrically connected to the first conductive connector, the first conductive line being embedded in a first dielectric material; a second conductive line disposed over and electrically connected to the second conductive connector, the second conductive line being embedded in the first dielectric material; a first die disposed over the second conductive line; a metal post disposed over and electrically connected to the first conductive line, the metal post being laterally displaced from the first die; a third conductive line disposed over and electrically connected to the first die; and external connectors disposed along outermost portions of the semiconductor package, the external connectors configured to transmit each external electrical connection into the semiconductor package, the second conductive line and the second conductive connector being electrically isolated from the external connectors. In an embodiment, in a plan view an entirety of a region overlapping the first die is isolated from the external connectors. In an embodiment, the first semiconductor package comprises: a second dielectric material; a second die, the second dielectric material being interposed between the second die and the first conductive connector; and a molding compound disposed around the second die. In an embodiment, the first semiconductor package further comprises: a fourth conductive line electrically connecting the first conductive connector to the second die; and a conductive feature being in physical contact with the second conductive connector. In an embodiment, the conductive feature comprises a plurality of conductive elements and extends from one side of the second dielectric material to the molding compound. In an embodiment, the second conductive connector has a greater diameter than the first conductive connector. In an embodiment, the semiconductor package further includes a third conductive connector, wherein the third conductive connector is in physical contact with the second conductive connector.

In an embodiment, a semiconductor package includes a first package, the first package comprising: a first die embedded in an encapsulant; a first interconnect structure disposed over the first die; a plurality of dielectric layers disposed below the first die; a second interconnect structure disposed within the plurality of dielectric layers; and a conductive feature disposed below the plurality of dielectric layers, wherein the conductive feature and a portion of the plurality of dielectric layers form a thermal dissipation window, the portion extending from a bottom surface of the first die through an entirety of the plurality of dielectric layers, the thermal dissipation window being electrically isolated from the second interconnect structure; a second package; and first conductive connectors and second conductive connectors attaching the first package to the second package, one of the second conductive connectors being electrically connected to the conductive feature, the second conductive connectors and the conductive feature being electrically isolated from the second package. In an embodiment, the second package comprises a second die, and wherein one of the first conductive connectors electrically connects the second die to the first interconnect structure. In an embodiment, in a plan view the first conductive connectors form a grid-like pattern, wherein in the plan view three ones of the second conductive connectors form a line, and wherein adjacent pairs of the three ones of the second conductive connectors have different distances between one another. In an embodiment, in a plan view the thermal dissipation window has dimensions of about 1000 µm by about 1000 µm. In an embodiment, each of the second conductive connectors has a greater diameter than each of the first conductive connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first interconnect structure over a carrier, the first interconnect structure comprising first conductive elements embedded in dielectric layers;
    forming a thermal dissipation block over the carrier, the thermal dissipation block comprising second conductive elements embedded in the dielectric layers, wherein forming the thermal dissipation block is simultaneous with forming the first interconnect structure;
    forming metal posts over the first interconnect structure;
    attaching a first integrated circuit die over the first interconnect structure and the thermal dissipation block;
    removing the carrier;
    attaching a semiconductor package to the first interconnect structure and the thermal dissipation block using first electrical connectors and thermal dissipation connectors; and
    forming external electrical connectors, the external electrical connectors being configured to transmit each external electrical connection into the semiconductor device, the thermal dissipation block being electrically isolated from external electrical connection.

2. The method of claim 1, wherein in a plan view the first interconnect structure forms a ring around the thermal dissipation block.

3. The method of claim 1, wherein in a plan view the thermal dissipation block is free of the first interconnect structure, and wherein in the plan view the thermal dissipation block has dimensions of about 1000 µm and about 1000 µm.

4. The method of claim 1, wherein the second conductive elements of the thermal dissipation block comprise:
    three layers of conductive lines; and
    conductive vias being interposed between adjacent pairs of the three layers of conductive lines.

5. The method of claim 1 further comprising:
    forming a second interconnect structure over and electrically connected to the metal posts and the first integrated circuit die; and
    forming second electrical connectors over the second interconnect structure.

6. The method of claim 1, wherein the semiconductor package comprises:
    a second integrated circuit die embedded in a molding compound;
    a substrate adjacent to the molding compound; and
    a third interconnect structure embedded in the substrate, the third interconnect structure being electrically interposed between the second integrated circuit die and the first interconnect structure.

7. The method of claim 6, wherein the semiconductor package further comprises thermal dissipation features, and wherein the thermal dissipation connectors physically contact the thermal dissipation block and the thermal dissipation features.

8. The method of claim 7, wherein the thermal dissipation features extend from one side of the substrate to another side of the substrate.

9. A semiconductor package comprising:
    a first conductive connector, a second conductive connector, and a third conductive connector disposed over a first semiconductor package;
    a first conductive line disposed over and electrically connected to the first conductive connector, the first conductive line being embedded in a first dielectric material;
    a second conductive line disposed over and electrically connected to the second conductive connector, the second conductive line being embedded in the first dielectric material;

a third conductive line disposed over and electrically connected to the third conductive connector, the third conductive line being embedded in the first dielectric material, the second conductive line and the third conductive line being electrically shorted by the second conductive connector and the third conductive connector being in physical contact;

a first die disposed over the second conductive line;

a metal post disposed over and electrically connected to the first conductive line, the metal post being laterally displaced from the first die;

an interconnect structure disposed over and electrically connected to the first die; and external connectors disposed along outermost portions of the semiconductor package, the external connectors configured to transmit each external electrical connection into the semiconductor package, the second conductive line and the second conductive connector being electrically isolated from the external connectors.

10. The semiconductor package of claim 9, wherein in a plan view an entirety of a region overlapping the first die is isolated from the external connectors.

11. The semiconductor package of claim 9, wherein the first semiconductor package comprises:
a second dielectric material;
a second die, the second dielectric material being interposed between the second die and the first conductive connector; and
a molding compound disposed around the second die.

12. The semiconductor package of claim 11, wherein the first semiconductor package further comprises:
a fourth conductive line electrically connecting the first conductive connector to the second die; and
a conductive feature being in physical contact with the second conductive connector.

13. The semiconductor package of claim 12, wherein the conductive feature comprises a plurality of conductive elements and extends from one side of the second dielectric material to the molding compound.

14. The semiconductor package of claim 9, wherein the second conductive connector has a greater diameter than the first conductive connector.

15. A semiconductor package comprising:
a first package, the first package comprising:
a first die embedded in an encapsulant;
a first interconnect structure disposed over the first die;
a plurality of dielectric layers disposed below the first die;
a second interconnect structure disposed within the plurality of dielectric layers; and
a conductive feature disposed below the plurality of dielectric layers, wherein the conductive feature and a portion of the plurality of dielectric layers form a thermal dissipation window, the portion extending from a bottom surface of the first die through an entirety of the plurality of dielectric layers, the thermal dissipation window being electrically isolated from the second interconnect structure;
a second package, the second package comprising:
a third interconnect structure embedded in a substrate;
a molding compound along the substrate;
a second die embedded in the molding compound; and
a through via extending from a first surface of the substrate to a second surface of the molding compound, the first surface and the second surface facing away from one another; and
first conductive connectors and second conductive connectors attaching the first package to the second package, one of the second conductive connectors being electrically connected to the conductive feature, the second conductive connectors and the conductive feature being electrically isolated from the second package.

16. The semiconductor package of claim 15, wherein one of the first conductive connectors and the third interconnect structure electrically connect the second die to the first interconnect structure.

17. The semiconductor package of claim 16, wherein in a plan view the first conductive connectors form a grid-like pattern, wherein in the plan view three ones of the second conductive connectors form a line, and wherein adjacent pairs of the three ones of the second conductive connectors have different distances between one another.

18. The semiconductor package of claim 15, wherein in a plan view the thermal dissipation window has dimensions of about 1000 µm by about 1000 µm.

19. The semiconductor package of claim 15, wherein each of the second conductive connectors has a greater diameter than each of the first conductive connectors.

20. The method of claim 1, wherein the first integrated circuit die is separated from the second conductive elements of the thermal dissipation block by a topmost layer of the dielectric layers.

* * * * *